US008417473B2

(12) United States Patent
Wu et al.

(10) Patent No.: US 8,417,473 B2
(45) Date of Patent: Apr. 9, 2013

(54) METHOD FOR ESTIMATING INTER-CHANNEL DELAY AND APPARATUS AND ENCODER THEREOF

(75) Inventors: Wenhai Wu, Beijing (CN); Yue Lang, München (DE); Lei Miao, Beijing (CN); Zexin Liu, Beijing (CN); Chen Hu, Shenzhen (CN); Qing Zhang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/245,303

(22) Filed: Sep. 26, 2011

(65) Prior Publication Data

US 2012/0016632 A1 Jan. 19, 2012

Related U.S. Application Data

(63) Continuation of application No. PCT/CN2010/071314, filed on Mar. 25, 2010.

(30) Foreign Application Priority Data

Mar. 25, 2009 (CN) .......................... 2009 1 0129492

(51) Int. Cl.
*G01R 25/04* (2006.01)

(52) U.S. Cl.
USPC ................................ 702/79; 702/89; 327/233

(58) Field of Classification Search .................... 702/57, 702/66, 69, 71, 72, 79, 89; 700/306; 327/233, 327/237
See application file for complete search history.

(56) References Cited

U.S. PATENT DOCUMENTS 4,890,065 A * 12/1989 Laletin .......................... 327/233
5,434,948 A 7/1995 Holt et al.

(Continued)

FOREIGN PATENT DOCUMENTS

CN 1860526 A 11/2006
EP 1 953 736 A1 8/2008

(Continued)

OTHER PUBLICATIONS

Extended European Search Report dated (mailed) Jan. 12, 2012, issued in related Application No. 10755445.3-2225, Hauwei Technologies Co., Ltd.

(Continued)

*Primary Examiner* — Manuel L Barbee
(74) *Attorney, Agent, or Firm* — Conley Rose, P.C.; Grant Rodolph; Nicholas K. Beaulieu

(57) ABSTRACT

A method for estimating inter-channel delay and an apparatus for estimating inter-channel delay and an encoder are provided by the embodiments of the present invention. The method includes: obtaining signal sound field information from a cross-correlation function and a cumulative cross-correlation function of synthetic signals of left and right sound channels respectively; obtaining adjustment information of the cumulative cross-correlation function according to the sound field information that is respectively obtained; adjusting the cumulative cross-correlation function by using the adjustment information, so as to obtain the adjusted cumulative cross-correlation function; and determining a time corresponding to a maximum value in the adjusted cumulative cross-correlation function as an inter-channel delay. Therefore, the delay between the signals of the left and right sound channels can be estimated correctly, so as to improve the stability of the synthetic stereo sound field.

20 Claims, 10 Drawing Sheets

U.S. PATENT DOCUMENTS

| | | | | |
|---|---|---|---|---|
| 6,973,184 | B1 | 12/2005 | Shaffer et al. | |
| 7,006,587 | B1 | 2/2006 | Lewis et al. | |
| 2005/0179777 | A1* | 8/2005 | Ferguson | 348/180 |
| 2006/0023871 | A1 | 2/2006 | Shaffer et al. | |
| 2007/0036360 | A1 | 2/2007 | Breebaart | |
| 2008/0118084 | A1 | 5/2008 | Moon et al. | |
| 2008/0310646 | A1 | 12/2008 | Amada | |
| 2009/0119111 | A1 | 5/2009 | Goto et al. | |

FOREIGN PATENT DOCUMENTS

| | | | |
|---|---|---|---|
| WO | WO 2006/060278 | A1 | 6/2006 |
| WO | WO 2008/016097 | A1 | 2/2008 |
| WO | WO 2008/153944 | A1 | 12/2008 |

OTHER PUBLICATIONS

Written Opinion of the International Searching Authority (translation) dated (mailed) Jul. 1, 2010, issued in related Application No. PCT/CN2010/071314, filed Mar. 25, 2010, Huawei Technologies Co., Ltd.

International Search Report in International Application No. PCT/CN2010/071314 mailed Jul. 1, 2010.

Foreign Communication from A Counterpart Application, European application 10755445.3, Office Action dated Jan. 2, 2013, 7 pages.

* cited by examiner

METHOD FOR ESTIMATING INTER-CHANNEL DELAY AND APPARATUS AND ENCODER THEREOF

CROSS-REFERENCE TO RELATED APPLICATIONS

This application is a continuation of International Application No. PCT/CN2010/071314, filed on Mar. 25, 2010, which claims priority to Chinese Patent Application No. 200910129492.3, filed on Mar. 25, 2009, both of which are hereby incorporated by reference in their entireties.

FIELD OF THE INVENTION

The present invention relates to communication technologies, and in particular, to a method for estimating inter-channel delay and an apparatus and an encoder thereof.

BACKGROUND OF THE INVENTION

With the development of the computer technology and the digital signal processing technology and the requirements for developing high-definition television sound systems and home audio-visual systems, the stereo technology is developed greatly, and definitely, this also raises higher requirements for the stereo technology especially for the encoding/decoding technology.

The common stereo coding method is the parametric stereo coding method. In the parametric stereo coding method, signals of left and right sound channels are usually not coded directly, instead, the signals of the left and right sound channels are downmixed to obtain a downmix signal, and the downmix signal is coded. Some extra sideband information is added during the coding. At a decoding end, stereo signals can be restored through the downmix signal and the sideband information. Estimation of the quality of the stereo signal depends on the quality of the downmix signal to a great extent. That is, at a coding end, the more synchronous the signals of the left and right sound channels, the less the information is lost in the downmixing process. However, in general circumstances, a sound-producing object may have distance change or distance difference relative to two microphones that are used for recording left and right sound channels, which may definitely result in a problem that the signals of the left and right sound channels cannot be completely synchronous, that is, a certain delay may exist between the signals of the left and right sound channels. To keep the signals of the left and right sound channels synchronous, a method for estimating delay is put forward, so as to improve the quality of the stereo synthetic signal.

Currently, the method for estimating delay in the prior art includes: before signals of left and right sound channels are generated into a downmix signal, obtaining a cumulative cross-correlation function of the signals of the left and right sound channels, taking a time corresponding to a maximum value in the cumulative cross-correlation function as a delay between the signals of the left and right sound channels, coding the delay, and sending the coded delay to a decoding end, so as to perform signal synthesis according to the delay at the decoding end, thereby maintaining stability of the sound field of the signals of the left and right sound channels. In actual applications, to maintain the delay between the left and right sound channels stable, the cumulative cross-correlation function is usually taken as a decision basis. For the sake of convenience, it is agreed that when the left sound channel is previous to the right sound channel, the delay is positive; otherwise, the delay is negative.

However, in the above method, when the sound field of the signals of the left and right sound channels changes, for example, when the sound field is converted from one direction to another direction, the positive and negative properties of the estimated delay change, but the prior art cannot well track such a change of the sound field, that is, when the sound field changes, the cumulative cross-correlation function cannot sense the change, so wrong delay estimation may be caused, and when the decoding end performs signal synthesis according to the wrong delay, the sound field of the signal may be instable.

In view of the above, during the research and practice for the prior art, the inventors of the present invention find that, in the existing implementation modes, when the sound field of the signals of the left and right sound channels changes, such a change of the sound field cannot be tracked well, and therefore, the delay between the left and right sound channels cannot be estimated correctly, thereby causing the synthetic stereo instability, reducing the stereo coding quality, and influencing the sound effect.

SUMMARY OF THE INVENTION

The present invention is directed to a method and an apparatus for estimating inter-channel delay, so as to estimate the delay between signals of left and right sound channels correctly, and improve the stability of the synthetic stereo sound field.

To solve the above technical problem, an embodiment of the present invention provides a method for estimating inter-channel delay, where the method includes:

obtaining signal sound field information from a cross-correlation function and a cumulative cross-correlation function of synthetic signals of the left and right sound channels respectively;

obtaining adjustment information of the cumulative cross-correlation function according to the sound field information respectively obtained;

adjusting the cumulative cross-correlation function by using the adjustment information, so as to obtain the adjusted cumulative cross-correlation function; and determining a time corresponding to a maximum value in the adjusted cumulative cross-correlation function as the inter-channel delay.

Accordingly, an embodiment of the present invention provides an apparatus for estimating inter-channel delay, where the apparatus includes:

an extracting unit, configured to obtain signal sound field information from a cross-correlation function and a cumulative cross-correlation function of synthetic signals of the left and right sound channels respectively;

an adjusting unit, configured to obtain adjustment information of the cumulative cross-correlation function according to the sound field information respectively obtained by the extracting unit, and adjust the cumulative cross-correlation function by using the adjustment information, so as to obtain the adjusted cumulative cross-correlation function; and a delay estimating unit, configured to determine a time corresponding to a maximum value in the cumulative cross-correlation function adjusted by the adjusting unit as the inter-channel delay.

Accordingly, an embodiment of the present invention further provides an encoder, and the encoder includes an apparatus for estimating inter-channel delay and an encoding apparatus, where the apparatus for estimating inter-channel delay is configured to obtain signal sound field information from a cross-correlation function and a cumulative cross-correlation function of synthetic signals of the left and right sound channels respectively, obtain adjustment information of the cumulative cross-correlation function according to the sound field information respectively obtained, adjust the cumulative cross-correlation function by using the adjustment information, so as to obtain the adjusted cumulative cross-correlation function, determine a time corresponding to a maximum value in the adjusted cumulative cross-correlation function as the inter-channel delay, and output the inter-channel delay to the encoding apparatus; and the encoding apparatus is configured to encode the received inter-channel delay, and send the encoded inter-channel delay.

In view of the above technical solutions, in the embodiments of the present invention, a cross-correlation function and a cumulative cross-correlation function between signals of the left and right sound channels are determined; the cumulative cross-correlation function is adjusted by using signal sound field information extracted from the cross-correlation function; and the time corresponding to the maximum value in the cumulative cross-correlation function is determined as an estimated delay. That is, when the sound field of the signals of the left and right sound channels changes, the information about the change of the sound field is extracted, so as to estimate the delay between the signals of the left and right sound channels correctly, so that the opposite end can synthesize the signals correctly according to the received delay, thereby improving the stability of the synthetic stereo sound field.

DETAILED DESCRIPTION OF THE EMBODIMENTS

The optimum implementation solutions of the present invention are described in the following in detail with reference to the accompanying drawings.

Figure 1:
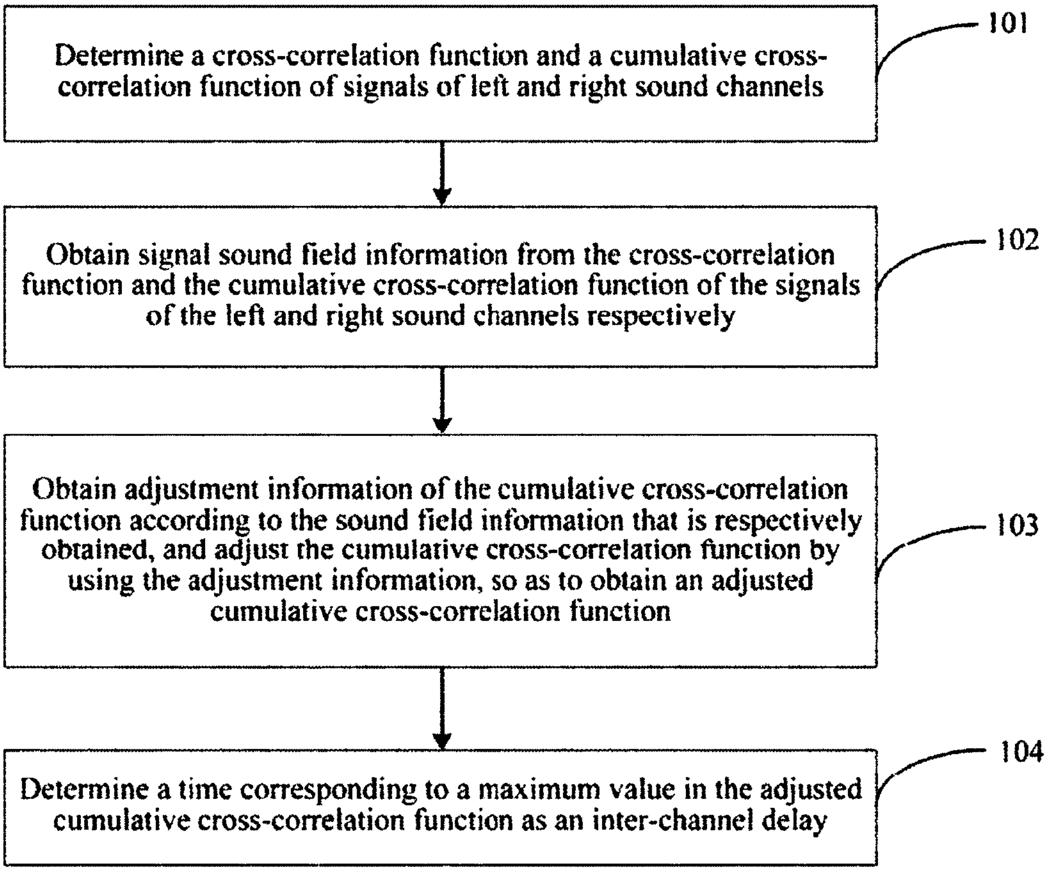
FIG. 1 is a flow chart of a method for estimating inter-channel delay according to an embodiment of the present invention.

FIG. 1 is a flow chart of a method for estimating inter-channel delay according to an embodiment of the present invention, and the method includes the following steps.

In step 101, a cross-correlation function and a cumulative cross-correlation function of signals of left and right sound channels are determined; the step is optional in this embodiment.

The formula of determining the cross-correlation function is $$ccf(d) = \sum_{n=0}^{N-1} l(n) * r(n-d) \Big/ sqrt\left(\sum_{n=0}^{N-1} l(n) * l(n) * \sum_{n=0}^{N-1} r(n-d) * r(n-d)\right)$$

where d is delay, which is a constant; n is the number of sampling points, which is a variable; r is the signal of the right sound channel; and l is the signal of the left channel.

Definitely, the cross-correlation function may also be determined through other formulae, and this embodiment is not limited thereto, for example, $$\text{if}\left(\sum_{n=0}^{N-1} l(n) * r(n-d) > 0\right)$$

$$ccf(d) = \left(\sum_{n=0}^{N-1} l(n) * r(n-d)\right)^2 \Big/ \left(\sum_{n=0}^{N-1} l(n) * l(n) * \sum_{n=0}^{N-1} r(n-d) * r(n-d)\right)$$

$$\text{if}\left(\sum_{n=0}^{N-1} l(n) * r(n-d) <= 0\right)$$

$$ccf(d) = 0)$$

and the cumulative cross-correlation function is a first grade MA function, for example, $$a\_ccf(d) = a\_ccf(d)*\alpha + ccf(d)\alpha \geqq 0$$

In this step, α is a weighting coefficient, which is a variable, and it is a well-known technology for persons skilled in the art to determine the cross-correlation function and the cumulative cross-correlation function thereof, which is not repeated herein.

In step 102, signal sound field information is obtained from the cross-correlation function and the cumulative cross-correlation function of the signals of the left and right sound channels respectively.

Sound field information of a current frame cross-correlation function can be extracted from the cross-correlation function, and sound field information of a cumulative cross-correlation function previous to the current frame cross-correlation function can be extracted from the cumulative cross-correlation function; or sound field information of a short-time cross-correlation function can be extracted from the cross-correlation function, and sound field information of a long-time cumulative cross-correlation function can be extracted from the cumulative cross-correlation function, which is not limited in this embodiment.

In step 103, adjustment information of the cumulative cross-correlation function is obtained according to the sound field information that is respectively obtained, and the cumulative cross-correlation function is adjusted by using the adjustment information, so as to obtain the adjusted cumulative cross-correlation function.

A weighting coefficient of the cumulative cross-correlation function may be determined according to the extracted different sound field information, the cumulative cross-correlation function is adjusted by using the weighting coefficient, so as to obtain the adjusted cumulative cross-correlation function. The weighting coefficient of the cumulative cross-correlation function may also be determined by multiplying the value corresponding to the extracted signal type based on the determination of the weighting coefficient of the cumulative cross-correlation function; corresponding sound field types may also be determined by extracting different sound field information of the current frame cross-correlation function and the cumulative cross-correlation function; it is judged whether the corresponding sound field types are the same, and the weighting coefficient of the cumulative cross-correlation function is set according to a judgment result; and the cumulative cross-correlation function is adjusted by using the set weighting coefficient, so as to obtain the adjusted cumulative cross-correlation function.

In step 104, a time corresponding to a maximum value in the adjusted cumulative cross-correlation function is determined as an inter-channel delay.

The method further includes: judging whether the sound field information changes, and if the sound field information changes, performing step 103; otherwise, ending the process.

That is, in this embodiment, when the inter-channel delay is estimated, the sound field information of the current frame cross-correlation function and the sound field information of the cumulative cross-correlation function previous to the current frame cross-correlation function are first extracted, the weighting coefficient of the cumulative cross-correlation function is calculated according to the extracted sound field information, and the cumulative cross-correlation function is adjusted by using the modified weighting coefficient, so as to estimate the delay between the signals of the left and right sound channels when the sound field changes. That is, this embodiment extracts information about change of the sound field, and adjusts the delay estimation between the left and right sound channels according to the changed sound field. Specifically, adaptive weighted adjustment is performed on the cumulative cross-correlation function of the delay estimation according to the change of the extracted sound information of the current frame cross-correlation function and the change of the extracted sound field information of the cumulative cross-correlation function, or adaptive weighted adjustment is performed on the cumulative cross-correlation function of the delay estimation related function according to the change of the sound field information of the short-time cross-correlation function and the change of the sound field information of the long-time cumulative cross-correlation function, or adaptive weighted adjustment is performed on the cumulative cross-correlation function of the delay estimation related function according to the extracted signal type and the extracted sound field information, so as to estimate the delay between the signals of the left and right sound channels correctly and send the delay, so that the receiving end can synthesize the signals correctly according to the received delay, thereby improving the stability of the synthetic stereo sound field.

In order to facilitate comprehension of persons skilled in the art, description is given below with specific embodiments.

Embodiment 1

Figure 2:
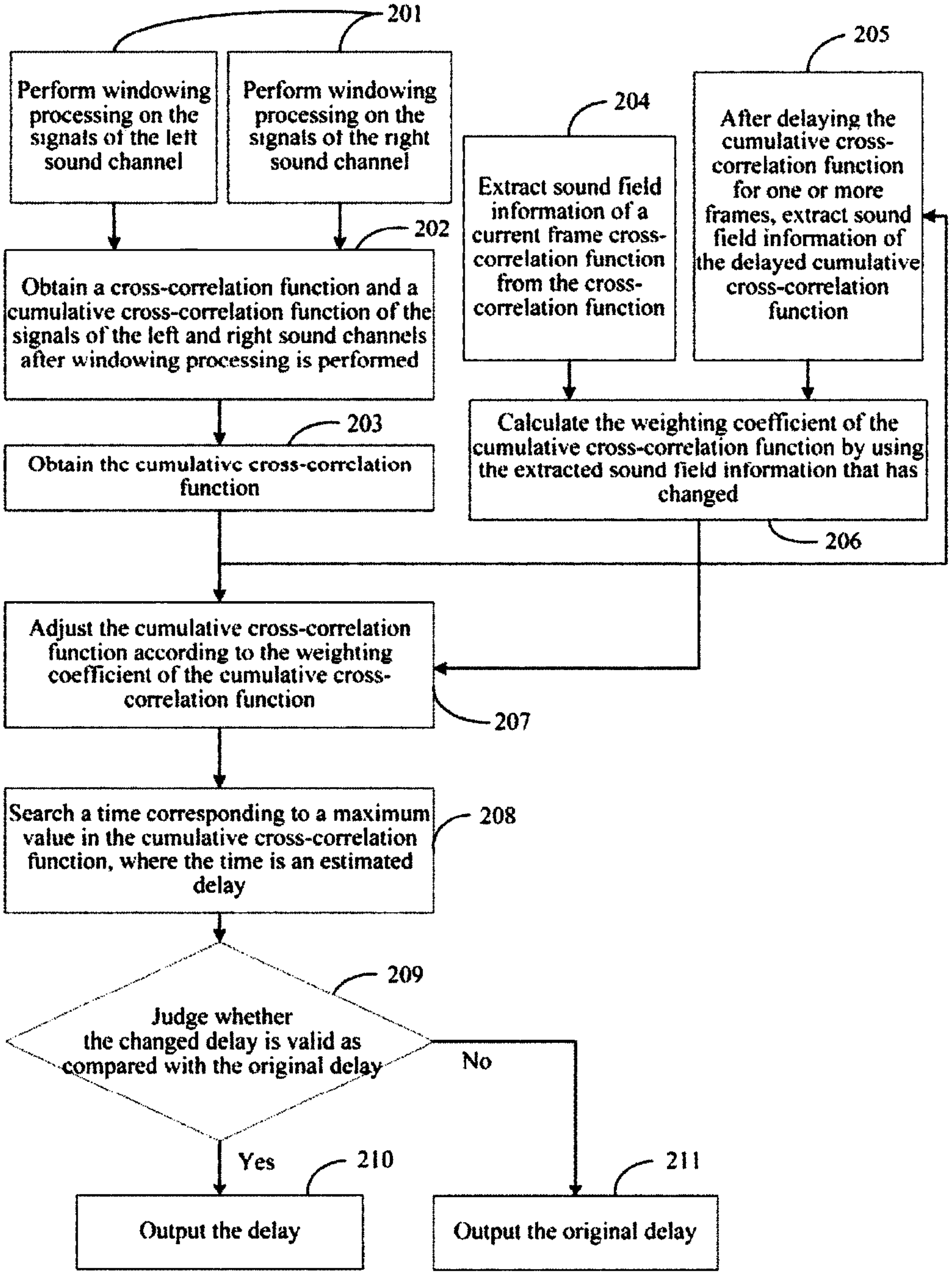
FIG. 2 is a flow chart of a method for estimating inter-channel delay according to Embodiment 1 of the present invention.

FIG. 2 is a flow chart of a method for estimating inter-channel delay according to Embodiment 1 of the present invention, and the method includes the following steps.

In step 201, windowing processing is performed on the signals of the left and right sound channels respectively, and the signals on which windowing processing is performed are output. This step is optional.

In step 202, a cross-correlation function of the signals of the left and right sound channels is obtained after windowing processing is performed. The specific process of obtaining the cross-correlation function is described in the above formula in detail, and is not repeated herein.

In step 203, the cumulative cross-correlation function is obtained. The specific process of obtaining the cumulative cross-correlation function is described in the above formula in detail, and is not repeated herein.

In step 204, sound field information of a current frame cross-correlation function is extracted from the cross-correlation function, which specifically includes:

operating a sum of current frame cross-correlation functions of first-part delay time and a sum of current frame cross-correlation functions of second-part delay time, so as to obtain a first sound field information value; and operating a sum of cumulative cross-correlation functions of first-part delay time and a sum of cumulative cross-correlation functions of second-part delay time, so as to obtain a second sound field information value.

The current frame cross-correlation functions of the first-part delay time are defined as current frame cross-correlation functions with the delay greater than or equal to 0, and the cumulative cross-correlation functions of the second-part delay time are defined as cumulative cross-correlation functions with the delay less than or equal to 0.

In this embodiment, the operation takes division and subtraction as an example, and the first sound field information value includes the following first ratio or first difference, and the second sound field information value includes the following second ratio or second difference. However, the present invention is not limited thereto.

One preferred manner of extracting the sound field information is: first determining the sum of the current frame cross-correlation functions with the delay greater than or equal to 0, then determining the sum of the current frame cross-correlation functions with the delay less than or equal to 0, and finally performing division between the sum of the current frame cross-correlation functions with the delay greater than or equal to 0 and the sum of the current frame cross-correlation functions with the delay less than or equal to 0, where the obtained ratio is referred to as a first ratio, and the first ratio is the extracted sound field information of the current frame cross-correlation function.

The other manner of extracting the sound field information is: first determining the sum of the current frame cross-correlation functions with the delay greater than or equal to 0, then determining the sum of the current frame cross-correlation functions with the delay less than or equal to 0, and finally performing subtraction between the sum of the current frame cross-correlation functions with the delay greater than or equal to 0 and the sum of the current frame cross-correlation functions with the delay less than or equal to 0, where the obtained difference is referred to as a first difference, and the first difference is the value of the extracted sound field information of the current frame cross-correlation function.

Definitely, the embodiment of the present invention is not limited thereto.

In step 205, after delaying the cumulative cross-correlation function for one or more frames (which is not limited in this embodiment), sound field information of the delayed cumulative cross-correlation function is obtained. For example, if the current frame is the Nth frame, the cumulative cross-correlation function is sound field information of cumulative cross-correlation functions of the past N-1 frames.

One extracting manner is: first determining a sum of cumulative cross-correlation functions with the delay greater than or equal to 0, then determining a sum of cumulative cross-correlation functions with the delay less than or equal to 0, and finally performing division between the sum of cumulative cross-correlation functions with the delay greater than or equal to 0 and the sum of cumulative cross-correlation functions with the delay less than or equal to 0, where the obtained ratio is referred to as a second ratio, and the second ratio is the extracted sound field information of the cumulative cross-correlation function.

The other extracting manner is: first determining a sum of cumulative cross-correlation functions with the delay greater than or equal to 0, then determining a sum of cumulative cross-correlation functions with the delay less than or equal to 0, and finally performing subtraction between the sum of cumulative cross-correlation functions with the delay greater than or equal to 0 and the sum of cumulative cross-correlation functions with the delay less than or equal to 0, where the obtained difference is referred to as a second difference, and the second difference is the extracted sound field information of the cumulative cross-correlation function.

In step 206, the weighting coefficient of the cumulative cross-correlation function is calculated by using the extracted sound field information that has changed.

Many calculation manners exist, and this embodiment takes an absolute value of a difference between the first ratio and the second ratio, or an absolute value of a difference between the first difference and the second difference as an example, so as to obtain the weighting coefficient of the cumulative cross-correlation function, but the present invention is not limited thereto.

In step 207, the cumulative cross-correlation function is adjusted according to the weighting coefficient of the cumulative cross-correlation function.

Figure 3:
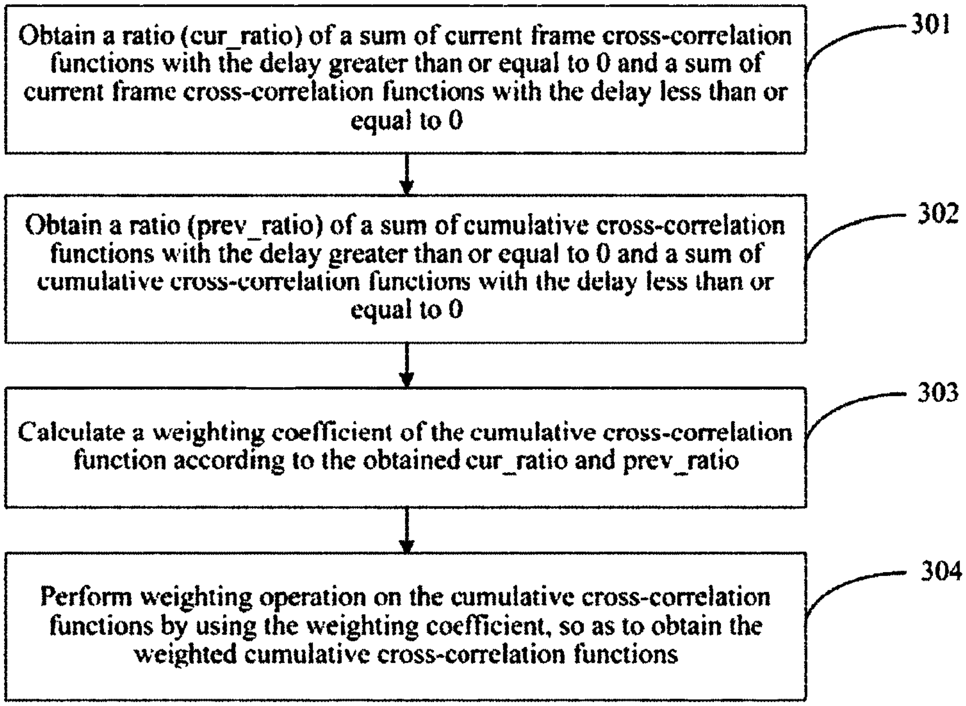
FIG. 3 is a flow chart of adjusting a cumulative cross-correlation function by using sound field information according to Embodiment 1 of the present invention.
Figure 4:
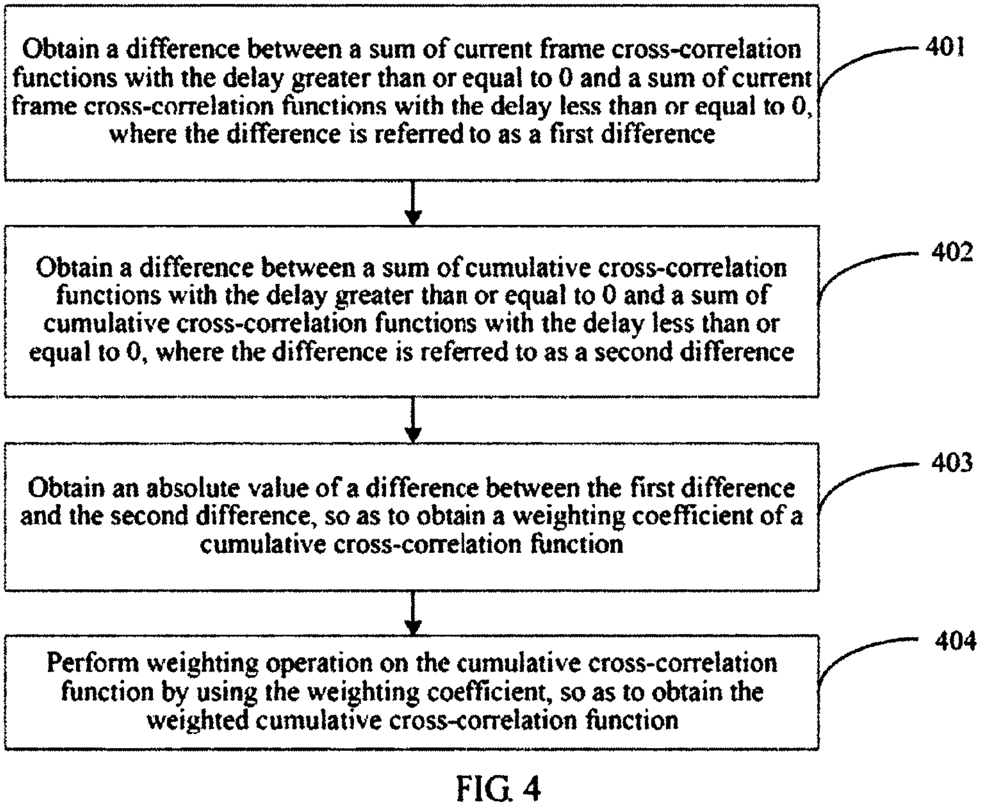
FIG. 4 is another flow chart of adjusting a cumulative cross-correlation function by using sound field information according to Embodiment 1 of the present invention.

The specific adjusting process also means calculating the cumulative cross-correlation function by taking the calculated weighting coefficient as the adjustment weighting coefficient, and the specific implementation is shown in FIGS. 3 and 4 in detail.

In step 208, a time corresponding to a maximum value in the cumulative cross-correlation function is searched, and the time is an estimated delay.

The specific searching manner is a well-known technology for persons skilled in the art, and is not repeated herein.

In step 209, it is judged whether the changed delay is valid as compared with the original delay, and if the changed delay is valid as compared with the original delay, step 210 is performed; otherwise, step 211 is performed. The judgment basis is that: the determined delay is compared with the original delay, and if the determined delay satisfies the required condition, it is valid; otherwise, it is invalid.

In step 210, the delay is output.

In step 211, the original delay is output.

In this embodiment, whether the sound fields of the left and right sound channels change is judged by extracting the sound field information of the current frame cross-correlation function and the sound field information of the cumulative cross-correlation function previous to the current frame cross-correlation function, different weighting coefficients of the cumulative cross-correlation function are calculated according to the changed sound fields, and the cumulative cross-correlation function is adjusted according to the weighting coefficients, so as to track the change of the sound fields, thereby estimating a more accurate delay.

FIG. 3 is a flow chart of adjusting a cumulative cross-correlation function by using sound field information according to Embodiment 1 of the present invention. In this embodiment, $Ccf(n) -T<n<T, T>0$ is taken as an example of the current frame cross-correlation function, and $ac\_Ccf(n), -T>n>T, T<0$ is taken as an example of the cumulative cross-correlation function previous to the current frame cross-correlation function; and the cross-correlation function includes a normalized cross-correlation function, but is not limited thereto. The flow specifically includes the following steps.

In step 301, a ratio (cur_ratio) of a sum of current frame cross-correlation functions with the delay greater than or equal to 0 and a sum of current frame cross-correlation functions with the delay less than or equal to 0 is obtained:

$$\text{cur\_ratio} = \sum_{n=0}^{T-1} Ccf(n) \Big/ \sum_{n=-T+1}^{0} Ccf(n).$$

In this step, the cur_ratio may be restricted within a certain range, for example, <min, max>, where values of min and max may be set according to experience, or the value of min may be set as 0, and the value of max may be set as infinity, which are not limited in this embodiment. The objective of setting the <min, max> is preventing a case that the cur_ration is too large or too small.

In step 302, a ratio (prev_ratio) of a sum of cumulative cross-correlation functions with the delay greater than or equal to 0 and a sum of cumulative cross-correlation functions with the delay less than or equal to 0 is obtained:

$$\text{prev\_ratio} = \sum_{n=0}^{T-1} \text{ac\_Ccf}(n) \Big/ \sum_{n=-T+1}^{0} \text{ac\_Ccf}(n);$$

and the prev_ratio may be restricted between <min, max>, and the <min, max> is the same as the range of the cur_ratio, which is not repeated herein.

In step 303, a weighting coefficient of the cumulative cross-correlation function is calculated according to the obtained cur_ratio and prev_ratio, and one manner of calculating is: obtaining the weighting coefficient of the cumulative cross-correlation function according to the following formula (but is not limited thereto): $a=|cur\_ratio-prev\_ratio|/k+b$;

where a is the weighting coefficient of the cumulative cross-correlation function, the cur_ratio is the ratio of the sum of current frame cross-correlation functions with the delay greater than or equal to 0 and the sum of current frame cross-correlation functions with the delay less than or equal to 0, the prev_ratio is the ratio of the sum of cumulative cross-correlation functions with the delay greater than or equal to 0 and the sum of cumulative cross-correlation functions with the delay less than or equal to 0, and k and b are constants. For example, in actual applications, a set of parameters in the calculated weighting coefficient are: min=0.5, max=1.5, k=−0.2, b=1, but the present invention is not limited thereto.

In step 304, the weighting coefficient is used to perform weighting operation on the cumulative cross-correlation functions, so as to obtain the weighted cumulative cross-correlation functions, that is, the weighted cross-correlation functions can track the change of the sound field better.

This embodiment provides a form of the cumulative cross-correlation function, but is not limited to such a cumulative cross-correlation function, that is, the cumulative cross-correlation function of the inter-channel delay is a sum of the current frame cross-correlation function and the result of multiplying the cumulative cross-correlation function by a weighting coefficient, which is specifically:

$$ac\_\mathrm{Ccf}(n)=ac\_\mathrm{Ccf}(n)*\mathrm{a}+\mathrm{Ccf}(n)\; -T<n<T, T>0$$

where a is the weighting coefficient.

FIG. 4 is another flow chart of adjusting a cumulative cross-correlation function by using sound field information according to Embodiment 1 of the present invention, which specifically includes the following steps.

In step 401, a difference between a sum of current frame cross-correlation functions with the delay greater than or equal to 0 and a sum of current frame cross-correlation functions with the delay less than or equal to 0 is obtained, where the difference is referred to as a first difference.

In step 402, a difference between a sum of cumulative cross-correlation functions with the delay greater than or equal to 0 and a sum of cumulative cross-correlation functions with the delay less than or equal to 0 is obtained, where the difference is referred to as a second difference.

In step 403, an absolute value of a difference between the first difference and the second difference is obtained, so as to obtain a weighting coefficient of a cumulative cross-correlation function.

The weighting coefficient of the cumulative cross-correlation function can be obtained according to formula α=|the first difference−the second difference|/k+b; and definitely, the formula of calculating the weighting coefficient is not limited thereto, and the weighting coefficient may also be calculated according to other formulae.

In step 404, weighting operation is performed on the cumulative cross-correlation function by using the weighting coefficient, so as to obtain the weighted cumulative cross-correlation function.

Figure 5:
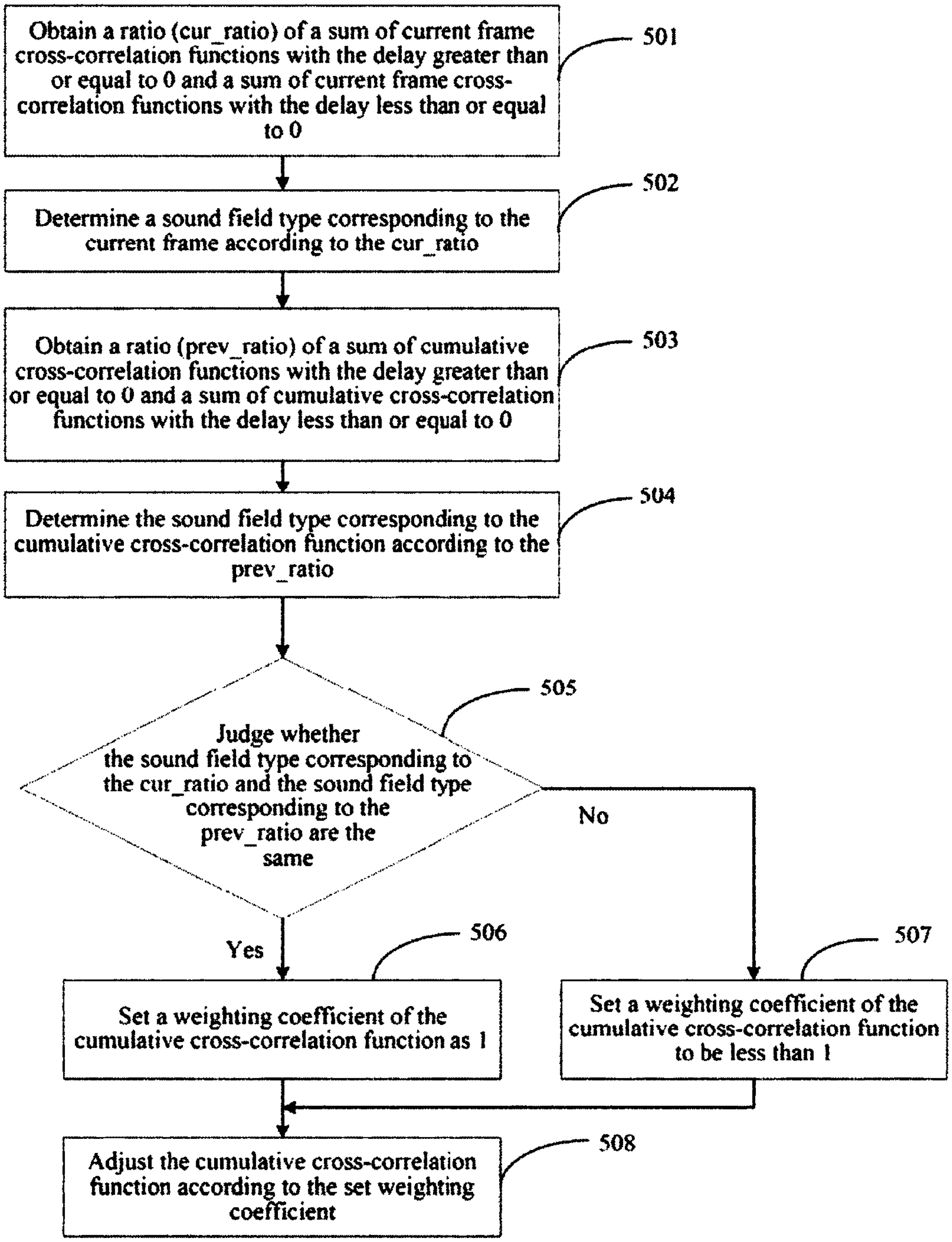
FIG. 5 is yet another flow chart of adjusting a cumulative cross-correlation function by using sound field information according to Embodiment 1 of the present invention.

FIG. 5 is yet another flow chart of adjusting a cumulative cross-correlation function by using sound field information according to Embodiment 1 of the present invention. In this embodiment, a sum of current frame cross-correlation functions with the delay greater than or equal to 0 and a sum of current frame cross-correlation functions with the delay less than or equal to 0 are obtained respectively first, sound field types are determined and judged according to a ratio of the sum of current frame cross-correlation functions with the delay greater than or equal to 0 and the sum of current frame cross-correlation functions with the delay less than or equal to 0, that is, it is judged whether the sound field types corresponding to the ratio are the same, and a weighting coefficient of a cumulative cross-correlation function is set according to a judgment result; and the cumulative cross-correlation function is adjusted by using the set weighting coefficient:

In this embodiment, Ccf(n)−T<n<T,T>0 is still taken as an example of the current frame cross-correlation function, and ac_Ccf(n),−T<n<T,T>0 is still taken as an example of the cumulative cross-correlation function previous to the current frame cross-correlation function; and the cross-correlation function includes, but not limited to, a normalized cross-correlation function. Specifically, this embodiment includes the following steps.

In step 501, a ratio (cur_ratio) of a sum of current frame cross-correlation functions with the delay greater than or equal to 0 and a sum of current frame cross-correlation functions with the delay less than or equal to 0 is obtained:

$$\mathrm{cur\_ratio}=\sum_{n=0}^{T-1} Ccf(n) \Big/ \sum_{n=-T+1}^{0} Ccf(n).$$

Figure 6:
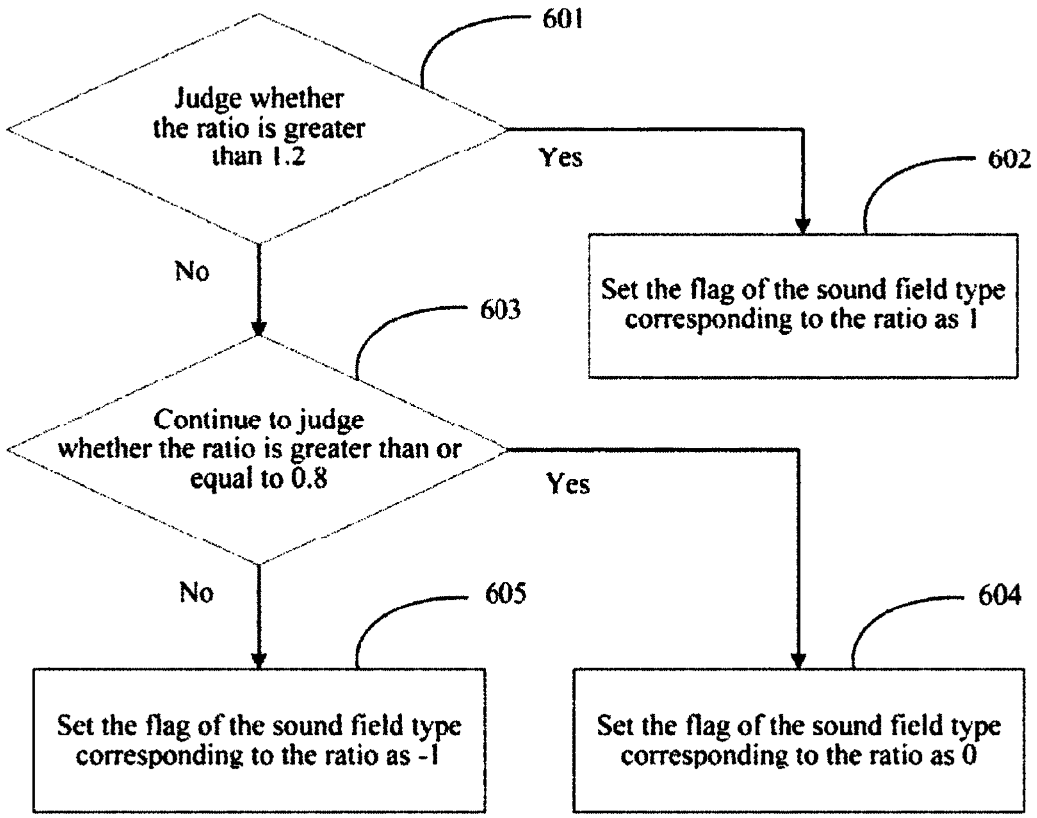
FIG. 6 is a flow chart of an application instance of judging a sound field type according to a ratio according to Embodiment 1 of the present invention.

In step 502, a sound field type corresponding to the current frame is determined according to the cur_ratio, and is labeled with Cur_Flag; which Specifically includes: judging whether the cur_ratio is greater than a first threshold that is preset; if the cur_ratio is greater than the first threshold, setting the flag of the sound field type corresponding to the cur_ratio as 1; otherwise, continuing to judge whether the cur_ratio is greater than or equal to a second threshold, and if the cur_ratio is greater than or equal to the second threshold, setting the flag of the sound field type corresponding to the cur_ratio as 0; otherwise, setting the flag of the sound field type corresponding to the cur_ratio as −1, where the second threshold is less than the first threshold; and the specific implementation is shown in FIG. 6 in detail.

In step 503, a ratio (prev_ratio) of a sum of cumulative cross-correlation functions with the delay greater than or equal to 0 and a sum of cumulative cross-correlation functions with the delay less than or equal to 0 is obtained:

$$\mathrm{prev\_ratio}=\sum_{n=0}^{T-1} \mathrm{ac\_Ccf}(n) \Big/ \sum_{n=-T+1}^{0} \mathrm{ac\_Ccf}(n)$$

In step 504, the sound field type corresponding to the cumulative cross-correlation function is determined according to the prev_ratio, and is labeled with prev_flag; and the determining process is similar to that in step 502, which specifically includes:

judging whether the prev_ratio is greater than the first threshold that is preset; if the prev_ratio is greater than the first threshold, setting the flag of the sound field type corresponding to the prev_ratio as 1; otherwise, continuing to judge whether the prev_ratio is greater than or equal to the second threshold, and if the prev_ratio is greater than or equal to the second threshold, setting the flag of the sound field type corresponding to the prev_ratio as 0; otherwise, setting the flag of the sound field type corresponding to the prev_ratio as −1, where the second threshold is less than the first threshold; and the specific implementation is shown in FIG. 5 in detail.

In step 505, it is judged whether the sound field type corresponding to the cur_ratio and the sound field type corresponding to the prev_ratio are the same, and if the sound field type corresponding to the cur_ratio and the sound field type corresponding to the prev_ratio are the same, steps 506 and 508 are performed; otherwise, steps 507 and 508 are performed.

In step 506, a weighting coefficient of the cumulative cross-correlation function is set as 1.

In step 507, the weighting coefficient of the cumulative cross-correlation function is set to be less than 1, and is generally set as 0.85, or may be set as other value less than 1, which is not limited in this embodiment.

In step 508, the cumulative cross-correlation function is adjusted according to the set weighting coefficient.

That is, weighting operation is performed on the cumulative cross-correlation function by using the weighting coefficient, so that the weighted cumulative cross-correlation function can better track the change of the sound field. This embodiment provides one form of the cumulative cross-correlation function, but is not limited to such a cumulative cross-correlation function, that is, the cumulative cross-correlation function with the inter-channel delay is a sum of the current frame cross-correlation function and a result of multiplying the cumulative cross-correlation function by a weighting coefficient:

$$ac\_Ccf(n)=ac\_Ccf(n)*rate+Ccf(n)\quad -T<n<T, T>0$$

where rate is the ratio of the weighting coefficients.

FIG. 6 is a flow chart of an application instance of judging a sound field type according to a ratio according to Embodiment 1 of the present invention. In this embodiment, the sound field can be divided into three types according to the ratio, when the ratio is greater than 1.2 (that is, the first threshold), the flag of the sound field type is set as 1; when the ratio is greater than 0.8 and less than or equal to 1.2 (that is, the second threshold), the flag of the sound field type is set as 0; and when the ratio is less than 0.8, the flag of the sound field type is set as −1. Therefore, different weighting coefficients can be set according to the changed sound field to adjust the cumulative cross-correlation function. The specific judging process includes:

step 601: judging whether the ratio is greater than 1.2; if the ratio is greater than 1.2, performing step 602; otherwise, performing step 603;

step 602: setting the flag of the sound field type corresponding to the ratio as 1, for example, Cur_Flag=1, or prev_flag=1;

step 603: continuing to judge whether the ratio is greater than or equal to 0.8, and if the ratio is greater than or equal to 0.8, performing step 604; otherwise, performing step 605;

step 604: setting the flag of the sound field type corresponding to the ratio as 0; and step 605: setting the flag of the sound field type corresponding to the ratio as −1.

In this embodiment, the ratio may be the cur_ratio, or the prev_ratio, which is not limited in this embodiment.

Embodiment 2

Figure 7:
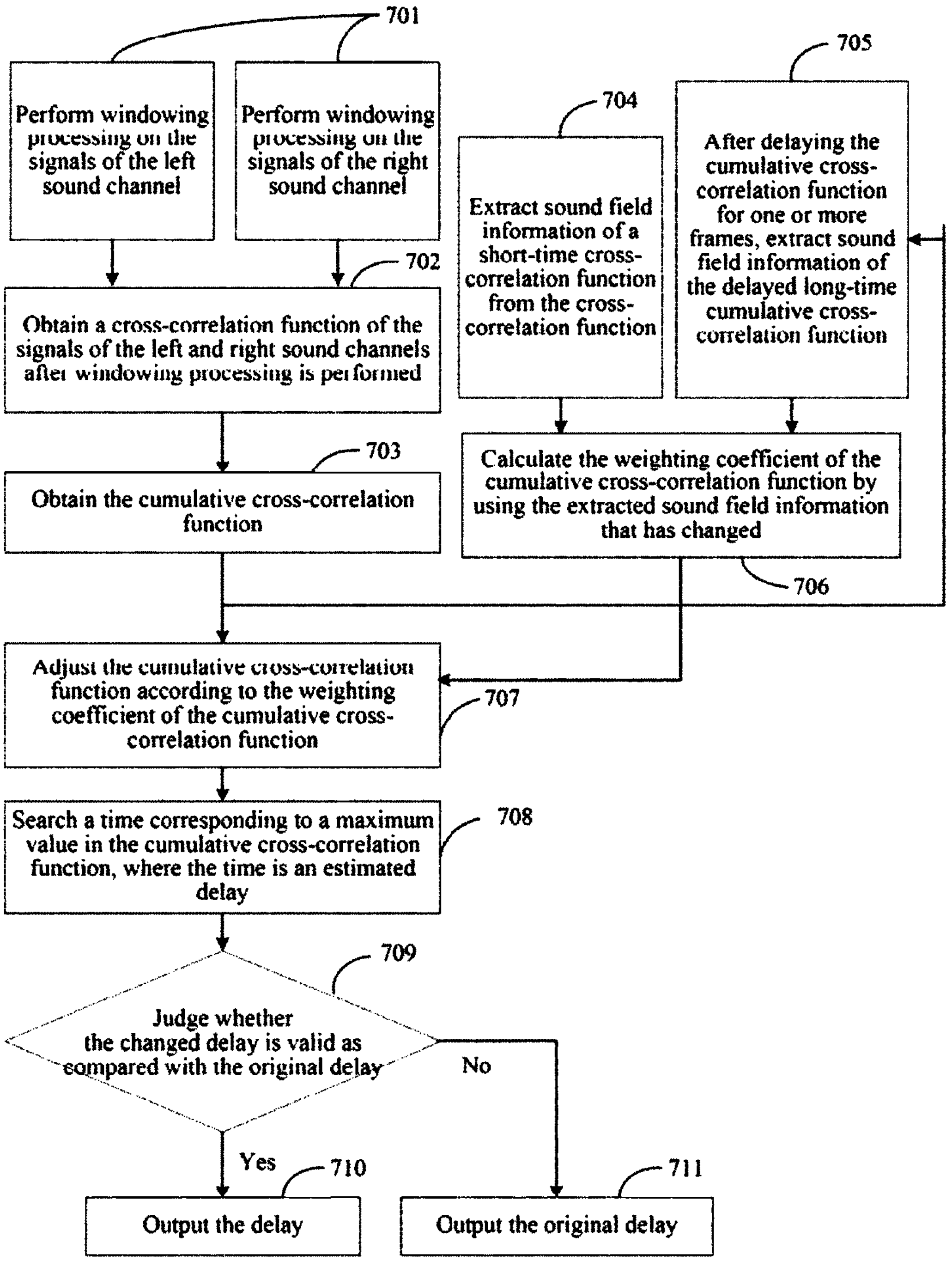
FIG. 7 is a flow chart of a method for estimating inter-channel delay according to Embodiment 2 of the present invention.

FIG. 7 is a flow chart of a method for estimating interchannel delay according to Embodiment 2 of the present invention. The implementation of this embodiment is similar to that of Embodiment 1, and the difference of Embodiment 2 includes: extracting sound field information of a short-time cross-correlation function from a cross-correlation function, extracting sound field information of a long-time cumulative cross-correlation function from a cumulative cross-correlation function, and then calculating a weighting coefficient of the cumulative cross-correlation function according to the extracted different sound field information. In this embodiment, the short-time cross-correlation function and the long-time cumulative cross-correlation function are relative concepts, for example, $$a\_ccf\mathbf{1}(d)=a\_ccf\mathbf{1}(d)*\alpha 1+ccf(d)$$

$$a\_ccf\mathbf{2}(d)=a\_ccf\mathbf{2}(d)*\alpha 2+ccf(d)$$

where, if α1 is greater than α2, a_ccf1(*d*) is the long-time cumulative cross-correlation function, and a_ccf2(*d*) is the short-time cumulative cross-correlation function. The specific implementation is as shown in FIG. 6, which specifically includes the following steps.

In step 701, windowing processing is performed on signals of left and right sound channels respectively, and the signals on which windowing processing is performed are output. This step is optional.

In step 702, a cross-correlation function of the signals of the left and right sound channels is obtained after windowing processing is performed.

In step 703, the cumulative cross-correlation function is obtained.

The specific implementation of steps 702 and 703 is shown in Embodiment 1 in detail, and is not repeated herein.

In step 704, sound field information of a short-time cross-correlation function is extracted from the cross-correlation function, which specifically includes:

operating a sum of short-time cross-correlation functions of third-part delay time and a sum of short-time cross-correlation functions of fourth-part delay time, so as to obtain a third sound field information value; and operating a sum of long-time cumulative cross-correlation functions of third-part delay time and a sum of long-time cumulative cross-correlation functions of fourth-part delay time, so as to obtain a fourth sound field information value;

where the short-time cross-correlation functions of the third-part delay time are defined as short-time cross-correlation functions with the delay greater than or equal to 0, and the long-time cumulative cross-correlation functions of the fourth-part delay time are defined as long-time cumulative cross-correlation functions with the delay less than or equal to 0.

In this embodiment, the operation takes division and subtraction as an example, and the third sound field information value includes the following third ratio or third difference, and the fourth sound field information value includes the following fourth ratio or fourth difference, which are not limited thereto.

One preferred manner of extracting the sound field information is: determining a ratio of a sum of short-time cross-correlation functions with the delay greater than or equal to 0 and a sum of short-time cross-correlation functions with the delay less than or equal to 0, and for the convenience of description, the ratio is referred to as a third ratio, where the third ratio is the extracted sound field information of the short-time cross-correlation functions;

The other manner of extracting the sound field information is: determining a sum of short-time cross-correlation functions with the delay greater than or equal to 0 and a sum of short-time cross-correlation functions with the delay less than or equal to 0, and performing subtraction between the sum of the short-time cross-correlation functions with the delay greater than or equal to 0 and the sum of the short-time cross-correlation functions with the delay less than or equal to 0, where the obtained difference is referred to as a third difference, and the third difference is the extracted sound field information of the short-time cross-correlation functions;

In step 705, after delaying the cumulative cross-correlation function for one or more frames (in this embodiment delaying the cumulative cross-correlation function for one frame is taken as an example), sound field information of a long-time cumulative cross-correlation function cumulated previous to the delayed short-time cross-correlation function is extracted.

One extracting manner is: determining a ratio of a sum of long-time cumulative cross-correlation functions with the delay greater than or equal to 0 and a sum of long-time cumulative cross-correlation functions with the delay less than or equal to 0, and for the convenience of description, the ratio is referred to as a fourth ratio, where the fourth ratio is the extracted sound field information of the long-time cumulative cross-correlation functions.

The other extracting manner is: determining a sum of long-time cumulative cross-correlation functions with the delay greater than or equal to 0 and a sum of long-time cumulative cross-correlation functions with the delay less than or equal to 0, and performing subtraction between the sum of the long-time cumulative cross-correlation functions with the delay greater than or equal to 0 and the sum of the long-time cumulative cross-correlation functions with the delay less than or equal to 0, where the obtained difference is referred to as a fourth difference, and the fourth difference is the extracted sound field information of the long-time cumulative cross-correlation functions.

In step 706, the weighting coefficient of the cumulative cross-correlation function is calculated by using the extracted sound field information that has changed.

Many calculation manners exist, and this embodiment takes an absolute value of a difference between the third ratio and the fourth ratio, or an absolute value of a difference between the third difference and the fourth difference as an example, so as to obtain the weighting coefficient of the cumulative cross-correlation function, but the present invention is not limited thereto.

In step 707, the cumulative cross-correlation function is adjusted according to the weighting coefficient of the cumulative cross-correlation function.

Figure 8:
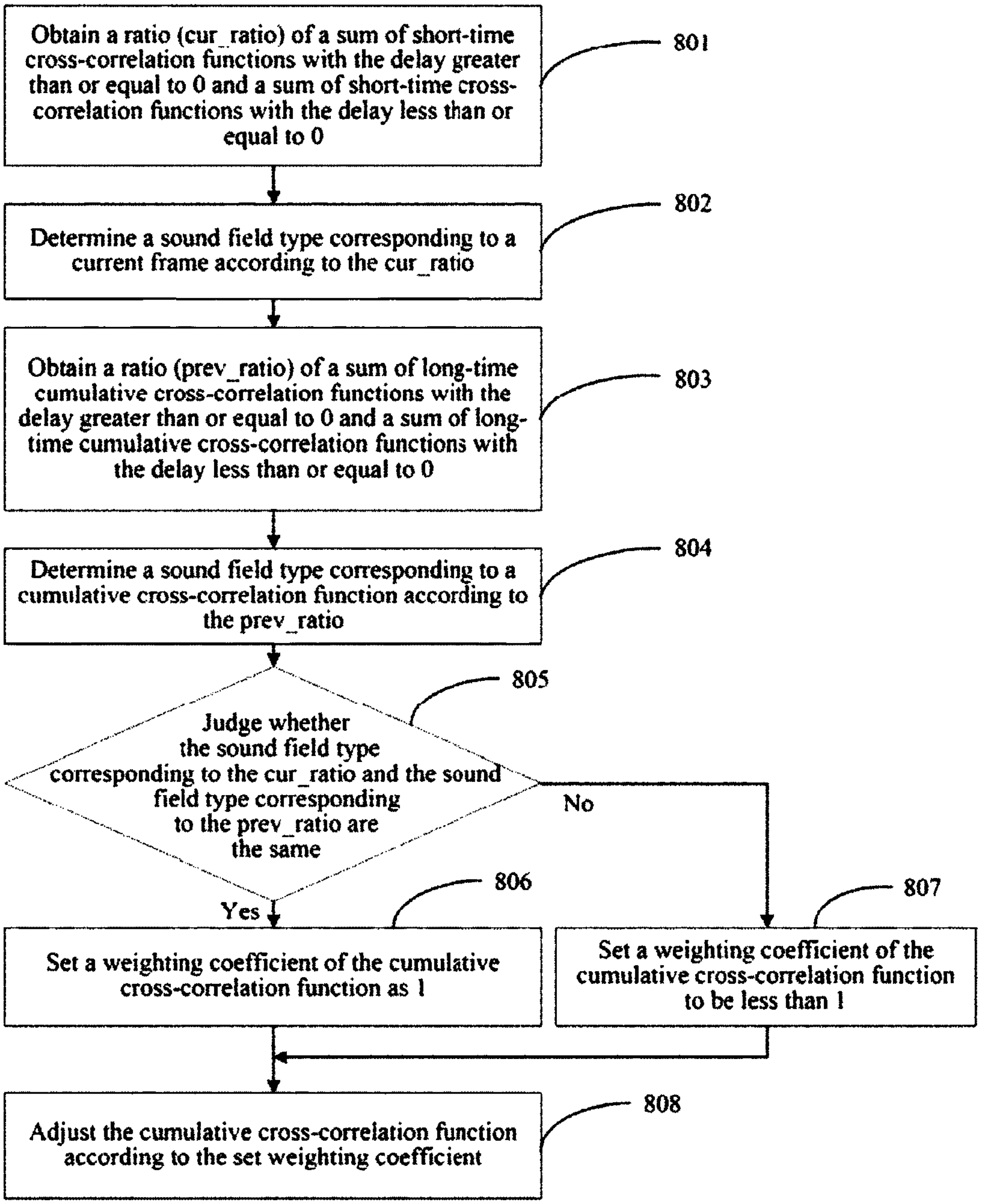
FIG. 8 is a flow chart of adjusting a cumulative cross-correlation function by using sound field information according to Embodiment 2 of the present invention.
Figure 9:
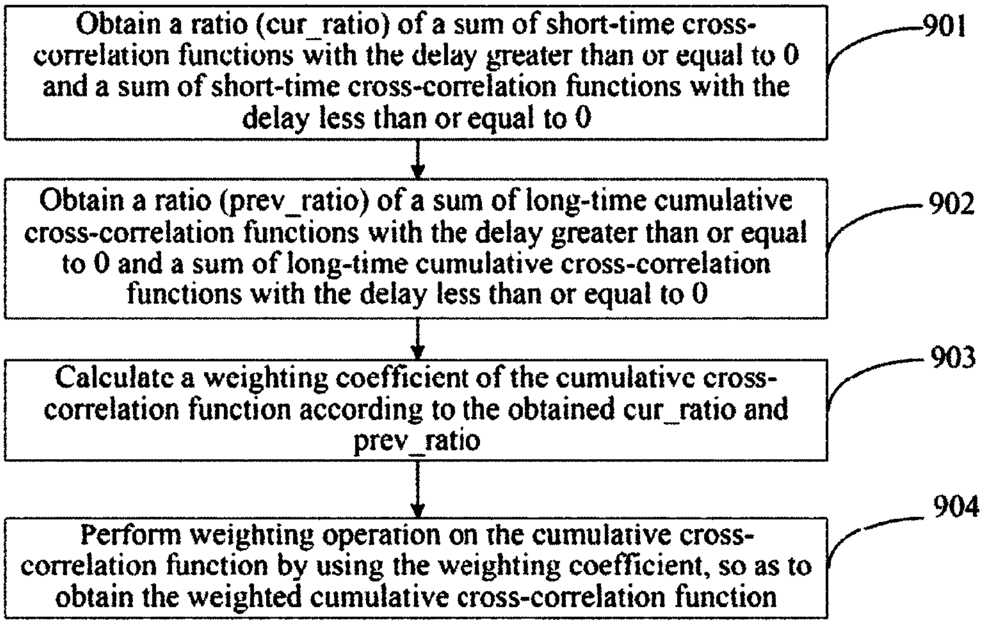
FIG. 9 is another flow chart of adjusting a cumulative cross-correlation function by using sound field information according to Embodiment 2 of the present invention.
Figure 10:
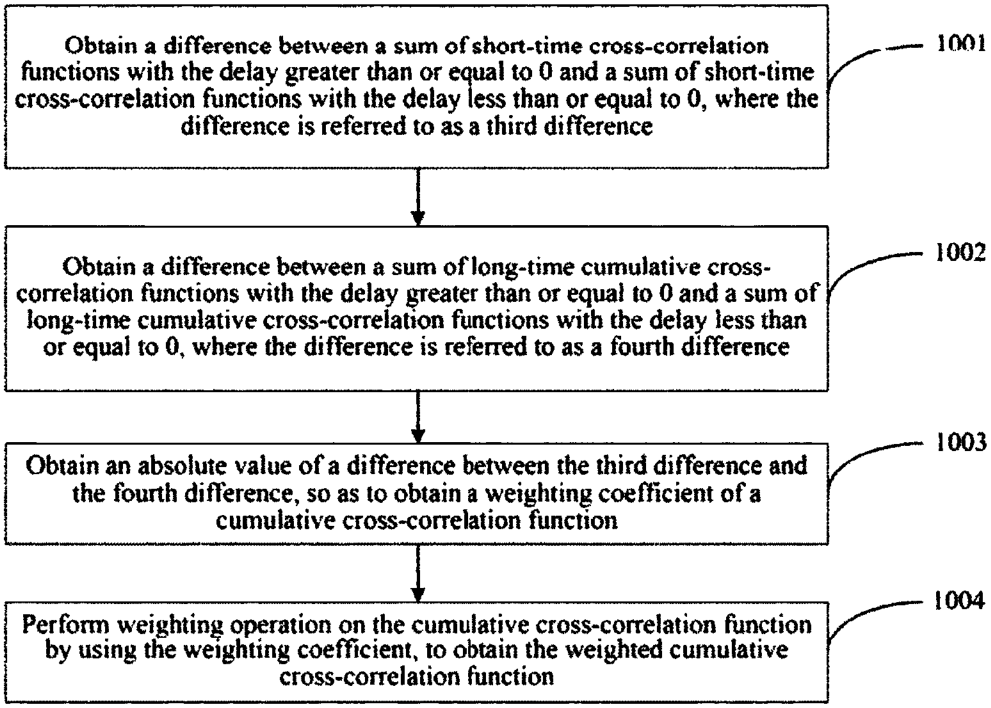
FIG. 10 is yet another flow chart of adjusting a cumulative cross-correlation function by using sound field information according to Embodiment 1 of the present invention.

The specific implementation is shown in FIGS. 8, 9, and 10 in detail.

In step 708, a time corresponding to a maximum value in the cumulative cross-correlation function is searched, where the time is an estimated delay.

In step 709, it is judged whether the changed delay is valid as compared with the original delay, and if the changed delay is valid as compared with the original delay, step 710 is performed; otherwise, the procedure returns to step 711. The judgment basis is: comparing the determined delay with the original delay, and if the determined delay satisfies the condition, it is valid; otherwise, it is invalid.

In step 710, the delay is output.

In step 711, the original delay is output.

In this embodiment, whether the sound fields of the left and right sound channels change is judged by extracting the sound field information of the short-time cross-correlation function and the sound field information of the long-time cumulative cross-correlation function cumulated previous to the short-time cross-correlation function, different weighting coefficients of the cumulative cross-correlation function are calculated according to the changed sound fields, and the cumulative cross-correlation function is adjusted according to the weighting coefficients; so as to track the change of the sound fields, thereby estimating a more accurate delay.

FIG. 8 is a flow chart of adjusting a cumulative cross-correlation function by using sound field information according to Embodiment 2 of the present invention. In this embodiment, a sum of short-time cross-correlation functions with the delay greater than or equal to 0 and a sum of short-time cross-correlation functions with the delay less than or equal to 0 are obtained respectively first, sound field types are determined and judged according to a ratio of the sum of short-time cross-correlation functions with the delay greater than or equal to 0 and the sum of short-time cross-correlation functions with the delay less than or equal to 0, that is, it is judged whether the sound field types corresponding to the ratio are the same, and a weighting coefficient of a cumulative cross-correlation function is set according to a judgment result; and the cumulative cross-correlation function is adjusted according to the set weighting coefficient.

In this embodiment, $a\_ccf\mathbf{2}(d) -T<d<T, T>0$ is taken as an example of the short-time cross-correlation function, and a $ccf\mathbf{1}(d), -T<d<T, T>0$ is taken as an example of the long-time cumulative cross-correlation function in the cumulative cross-correlation function.

The specific steps are included as follows.

In step 801, a ratio (cur_ratio) of a sum of short-time cross-correlation functions with the delay greater than or equal to 0 and a sum of short-time cross-correlation functions with the delay less than or equal to 0 is obtained. For the convenience of description, the ratio is referred to as a third ratio, and the specific formula is $$\text{cur\_ratio} = \sum_{n=0}^{T-1} \text{a\_acf2}(d) \Big/ \sum_{n=-T+1}^{0} \text{a\_acf1}(d).$$

In step 802, a sound field type corresponding to a current frame is determined according to the cur_ratio, and is labeled with Cur_Flag. The specific process is included as follows:

judging whether the third ratio is greater than a first threshold that is preset; if the third ratio is greater than the first threshold, setting the flag of the sound field type corresponding to the third ratio as 1; otherwise, continuing to judge whether the third ratio is greater than or equal to a second threshold, and if the third ratio is greater than or equal to the second threshold, setting the flag of the sound field type corresponding to the third ratio as 0; otherwise, setting the flag of the sound field type corresponding to the third ratio as −1, where the second threshold is less than the first threshold.

In step 803, a ratio (prev_ratio) of a sum of long-time cumulative cross-correlation functions with the delay greater than or equal to 0 and a sum of long-time cumulative cross-correlation functions with the delay less than or equal to 0 is obtained, where for the convenience of description, the ratio is referred to as a fourth ratio, and the specific formula is $$\text{prev\_ratio} = \sum_{n=0}^{T-1} \text{a\_ccf1}(d) \Big/ \sum_{n=-T+1}^{0} \text{a\_ccf2}(d).$$

In step 804, a sound field type corresponding to a cumulative cross-correlation function is determined according to the prev_ratio, and is labeled with prev_flag. The determining process is similar to that in step 802, and specifically includes:

judging whether the fourth ratio is greater than the first threshold that is preset; if the fourth ratio is greater than the first threshold, setting the flag of the sound field type corresponding to the fourth ratio as 1; otherwise, continuing to judge whether the fourth ratio is greater than or equal to the second threshold, and if the fourth ratio is greater than or equal to the second threshold, setting the flag of the sound field type corresponding to the fourth ratio as 0; otherwise, setting the flag of the sound field type corresponding to the fourth ratio as −1, where the fourth threshold is less than the third threshold.

In step 805, it is judged whether the sound field type corresponding to the cur_ratio and the sound field type corresponding to the prev_ratio are the same, and if the sound field type corresponding to the cur_ratio and the sound field type corresponding to the prev_ratio are the same, steps 806 and 808 are performed; otherwise, steps 807 and 808 are performed.

In step 806, a weighting coefficient of the cumulative cross-correlation function is set as 1.

In step 807, the weighting coefficient of the cumulative cross-correlation function is set to be less than 1, which is generally set as 0.85, or may be set as other value less than 1, but is not limited in this embodiment.

In step 808, the cumulative cross-correlation function is adjusted according to the set weighting coefficient.

In this embodiment, windowing processing is performed on the signals of the left and right sound channels respectively first, and a cross-correlation function between the two channels of signals is obtained; sound field information of a short-time cross-correlation function and sound field information of a long-time cumulative cross-correlation function cumulated in the past N-1 frames are extracted from the cross-correlation function, and a weighting coefficient of a related cumulative cross-correlation function is adjusted according to the extracted different sound field information; a maximum value of the cumulative cross-correlation function is searched from the cumulative cross-correlation function, and a time corresponding to the maximum value in the cumulative cross-correlation function is obtained, where the time is an estimated delay. It is judged whether the delay is a valid delay, and if the delay is a valid delay, the delay is output, so that the receiving end can synthesize the signals correctly according to the received delay, thereby improving the stability of the synthetic stereo sound field.

FIG. 9 is another flow chart of adjusting a cumulative cross-correlation function by using sound field information according to Embodiment 2 of the present invention. In this embodiment, a_ccf2($d$)$-T<d<T, T>0$ is taken as an example of the short-time cross-correlation function, and a_ccf1($d$),$-T<d<T, T>0$ is taken as an example of the long-time cross-correlation cumulative function in the cumulative cross-correlation function. This embodiment specifically includes the following steps.

In step 901, a ratio (cur_ratio) of a sum of short-time cross-correlation functions with the delay greater than or equal to 0 and a sum of short-time cross-correlation functions with the delay less than or equal to 0 is obtained, where for the convenience of description, the ratio is referred to as a third ratio, and the specific formula is $$\text{cur\_ratio} = \sum_{n=0}^{T-1} \text{a\_acf2}(d) \Big/ \sum_{n=-T+1}^{0} \text{a\_acf1}(d).$$

In step 902, a ratio (prev_ratio) of a sum of long-time cumulative cross-correlation functions with the delay greater than or equal to 0 and a sum of long-time cumulative cross-correlation functions with the delay less than or equal to 0 is obtained, where for the convenience of description, the ratio is referred to as a fourth ratio, and the specific formula is $$\text{prev\_ratio} = \sum_{n=0}^{T-1} \text{a\_ccf1}(d) \Big/ \sum_{n=-T+1}^{0} \text{a\_ccf2}(d);$$

In step 903, a weighting coefficient of the cumulative cross-correlation function is calculated according to the obtained cur_ratio and prev_ratio, where the weighting coefficient of the cumulative cross-correlation function can be obtained according to, but not limited to, the following formula:

$$a=|cur\_\text{ratio}-\text{prev\_ratio}|/k+b$$

where a is the weighting coefficient of the cumulative cross-correlation function, and k and b are constants. For example, in actual applications, a set of parameters in the calculated weighting coefficient are: min=0.5, max=1.5, k=−0.2, b=1, which, however, are not limited thereto.

In step 904, weighting operation is performed on the cumulative cross-correlation function by using the weighting coefficient, so as to obtain the weighted cumulative cross-correlation function, where the form of the cumulative cross-correlation function is described above in detail.

FIG. 10 is yet another flow chart of adjusting a cumulative cross-correlation function by using sound field information according to the Embodiment 1 of the present invention, which specifically includes the following steps.

In step 1001, a difference between a sum of short-time cross-correlation functions with the delay greater than or equal to 0 and a sum of short-time cross-correlation functions with the delay less than or equal to 0 is obtained, where the difference is referred to as a third difference.

In step 1002, a difference between a sum of long-time cumulative cross-correlation functions with the delay greater than or equal to 0 and a sum of long-time cumulative cross-correlation functions with the delay less than or equal to 0 is obtained, where the difference is referred to as a fourth difference.

In step 1003, an absolute value of a difference between the third difference and the fourth difference is obtained, so as to obtain a weighting coefficient of a cumulative cross-correlation function.

The weighting coefficient of the cumulative cross-correlation function can be obtained according to formula α=|the third difference−the fourth difference|/k+b. Definitely, the formula calculating the weighting coefficient is not limited thereto, and the weighting coefficient may also be calculated according to other formulae.

In step 1004, weighting operation is performed on the cumulative cross-correlation function by using the weighting coefficient, so as to obtain the weighted cumulative cross-correlation function.

Embodiment 3

Figure 11:
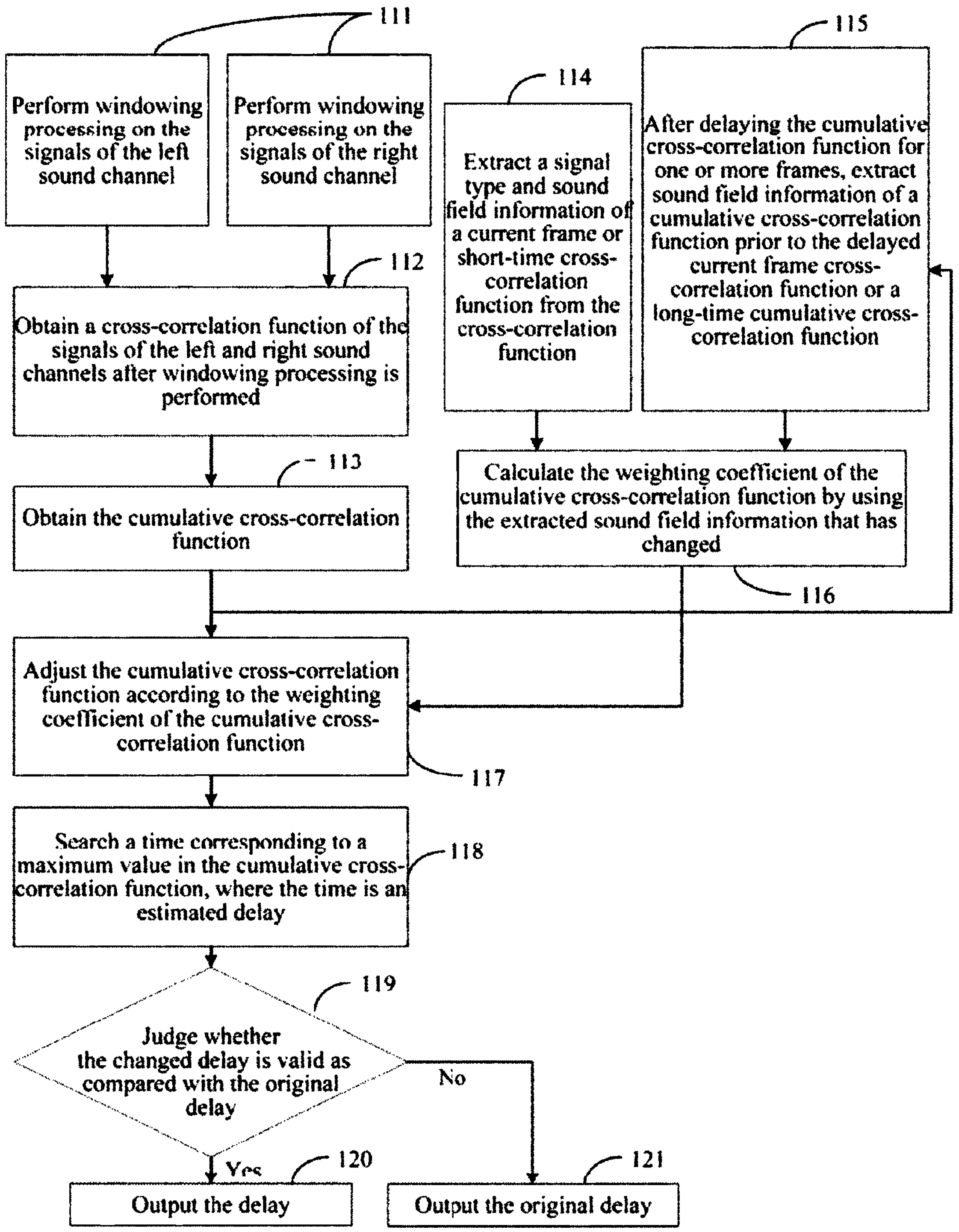
FIG. 11 is a flow chart of a method for estimating inter-channel delay according to Embodiment 3 of the present invention.

FIG. 11 is a flow chart of a method for estimating inter-channel delay according to Embodiment 3 of the present invention, and the method includes the following steps.

In step 111, windowing processing is performed on signals of left and right sound channels respectively, and the signals on which windowing processing is performed are output. This step is optional.

In step 112, a cross-correlation function of the signals of the left and right sound channels is obtained after windowing processing are performed.

In step 113, the cumulative cross-correlation function is obtained.

The specific implementation of steps 112 and 113 is shown in Embodiment 1 in detail, and is not repeated herein.

In step 114, a signal type and sound field information of a current frame or short-time cross-correlation function are extracted from the cross-correlation function.

The specific implementation of extracting the sound field information of the current frame or short-time cross-correlation function from the cross-correlation function is described above in detail, which is not repeated herein.

The process of extracting the signal type from the cross-correlation function includes: collecting the signal type from the cross-correlation function, where the specific collecting process is a well-known technology for persons skilled in the art, and is not repeated herein.

In step 115, after delaying the cumulative cross-correlation function for one or more frames (in this embodiment, delaying the cumulative cross-correlation function for one frame is taken as an example), sound field information of a cumulative cross-correlation function previous to the delayed current frame cross-correlation function or sound field information of a long-time cumulative cross-correlation function in the cumulative cross-correlation function is extracted, where the specific implementation is described above in detail, and is not repeated herein.

In step 116, a weighting coefficient of the cumulative cross-correlation function is calculated by using the extracted sound field information that has changed.

Many calculation manners exist, for example, taking an absolute value of a difference between the first ratio and the second ration, and then multiplying a value corresponding to the signal type by the obtained absolute value; or taking an absolute value of a difference between the first difference and the second difference, and then multiplying the value corresponding to the signal type by the obtained absolute value. Definitely, other calculation manners may also be available, which is not limited in this embodiment.

In step 117, the cumulative cross-correlation function is adjusted according to the weighting coefficient of the cumulative cross-correlation function.

In step 118, a time corresponding to a maximum value in the cumulative cross-correlation function is searched, where the time is an estimated delay.

In step 119, it is judged whether the changed delay is valid as compared with the original delay, and if the changed delay is valid as compared with the original delay, step 120 is performed; otherwise, step 121 is performed.

In step 120, the delay is output.

In step 121, the original delay is output.

In this embodiment, whether the sound fields of the left and right sound channels change is judged by extracting the signal type, the sound field information of the current frame or short-time cross-correlation function, and the sound field information of the cumulative cross-correlation function previous to the current frame cross-correlation function or the sound field information of the long-time cumulative cross-correlation function, different weighting coefficients of the cumulative cross-correlation function are calculated according to the changed sound fields, and the cumulative cross-correlation function is adjusted according to the weighting coefficients, so as to track the change of the sound fields, thereby estimating a more accurate delay.

Figure 12:
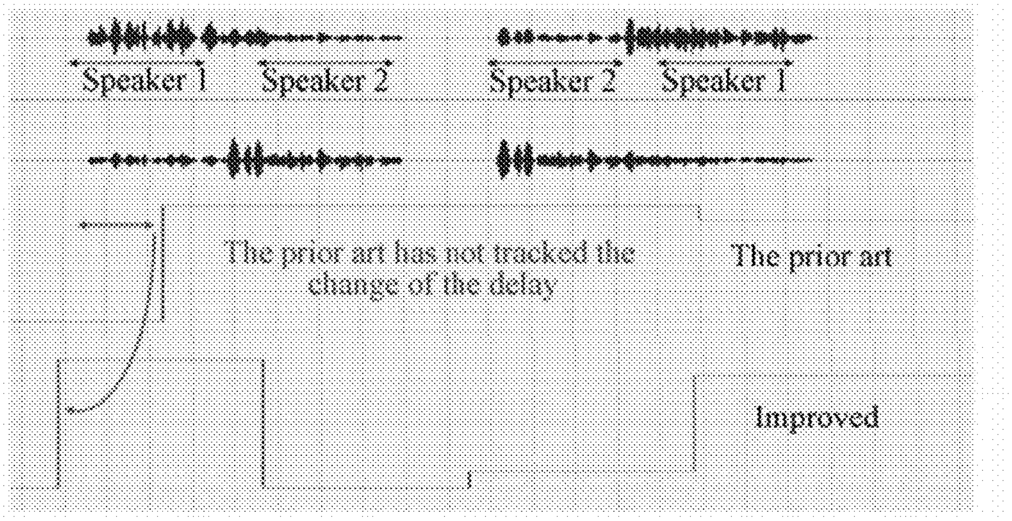
FIG. 12 is a schematic view of comparison of a segment of stereo signal delay estimation between the present invention and the prior art according to an embodiment of the present invention.

FIG. 12 is a schematic view of comparison of a segment of stereo signal delay estimation between the present invention and the prior art according to an embodiment of the present invention. It can be viewed from the corresponding waveform in FIG. 12 that, the estimated delay in this embodiment is faster than that in the prior art, so as to track the change of the delay more accurately.

Figure 13:
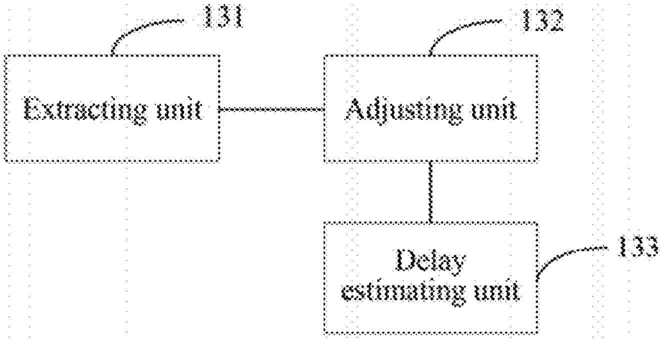
FIG. 13 is a schematic structural view of an apparatus for estimating inter-channel delay according to an embodiment of the present invention.

Based on the implementation of the above method, an embodiment of the present invention further provides an apparatus for estimating inter-channel delay, and a schematic structural view of the apparatus is shown in FIG. 13 in detail, which includes: an extracting unit 131, an adjusting unit 132, and a delay estimating unit 133. The extracting unit 131 is configured to obtain signal sound field information from a cross-correlation function and a cumulative cross-correlation function of signals of the left and right sound channels respectively; the adjusting unit 132 is configured to obtain adjust adjustment information of the cumulative cross-correlation function according to the sound field information that is respectively obtained by the extracting unit, and adjust the cumulative cross-correlation function by using the adjustment information, so as to obtain the adjusted cumulative cross-correlation function; and the delay estimating unit 133 is configured to determine a time corresponding to a maximum value in the cumulative cross-correlation function that is adjusted by the adjusting unit as an inter-channel delay.

The extracting unit specifically includes: a first extracting unit and a second extracting unit, where the first extracting unit is configured to extract sound field information from the cross-correlation function of the signals of the left and right sound channels and the second extracting unit is configured to extract sound field information from the cumulative cross-correlation function previous to the cross-correlation function extracted by the first extracting unit.

The first extracting unit includes: a first calculating unit and a first determining unit, where the first calculating unit is configured to calculate a sum of cross-correlation functions of first-part delay time and a sum of cross-correlation functions of second-part delay time and the first determining unit is configured to operate the sum, which is calculated by the first calculating unit, of the cross-correlation functions of the first-part delay time and the sum, which is calculated by the first calculating unit, of the cross-correlation functions of the second-part delay time to obtain a first sound field information value.

The second extracting unit includes: a second calculating unit and a second determining unit, where the second calculating unit is configured to calculate a sum of cumulative cross-correlation functions of first-part delay time and a sum of cumulative cross-correlation functions of second-part delay time; and the second determining unit is configured to operate the sum, which is calculated by the second calculating unit, of the cumulative cross-correlation functions of the first-part delay time and the sum, which is calculated by the second calculating unit, of the cumulative cross-correlation functions of the second-part delay time to obtain a second sound field information value.

The adjusting unit includes: a first coefficient calculating unit and a first adjusting unit, where the first coefficient calculating unit is configured to calculate a weighting coefficient of the cumulative cross-correlation function according to the first sound field information value and the second sound field information value, and the first adjusting unit is configured to adjust the cumulative cross-correlation function by using the weighting coefficient calculated by the first coefficient calculating unit, so as to obtain the adjusted cumulative cross-correlation function.

The adjusting unit includes: a first sound field type determining unit, a first judging unit, a first setting unit, and a second adjusting unit, where the first sound field type determining unit is configured to determine corresponding sound field types according to the first sound field information value determined by the first determining unit and the second sound field information value determined by the second determining unit; the first judging unit is configured to judge whether the sound field type corresponding to the first sound field information value and the sound field type corresponding to the second sound field information value are the same, and send a judgment result; the first setting unit is configured to set different weighting coefficients of the cumulative cross-correlation function according to the received judgment result sent by the first judging unit; and the second adjusting unit is configured to adjust the cumulative cross-correlation function by using the different weighting coefficients set by the first setting unit, so as to obtain the adjusted cumulative cross-correlation function.

The cross-correlation function of the signals of the left and right sound channels extracted by the first extracting unit includes: a current frame cross-correlation function, and the cumulative cross-correlation function previous to the cross-correlation function extracted by the first extracting unit includes: a cumulative cross-correlation function previous to the current frame cross-correlation function.

The cross-correlation function of the signals of the left and right sound channels extracted by the first extracting unit includes: a short-time cross-correlation function; and the cumulative cross-correlation function previous to the cross-correlation function extracted by the first extracting unit includes: a long-time cross-correlation function.

When the cross-correlation function is the short-time cross-correlation function, the first extracting unit further includes: a third extracting unit, configured to extract a signal type from the cross-correlation function of the signals of the left and right sound channels; and the adjusting unit further includes:

a second coefficient calculating unit, configured to perform, according to a value corresponding to the signal type, another weighting calculation on the cumulative cross-correlation function's weighting coefficient calculated by the first coefficient calculating unit, so as to obtain a calculated weighting coefficient of the cumulative cross-correlation function; and a third adjusting unit, configured to adjust the cumulative cross-correlation function by using the calculated weighting coefficient calculated by the second coefficient calculating unit, so as to obtain the adjusted cumulative cross-correlation function.

The apparatus further includes: a judging unit, configured to judge whether the sound field information changes, and send to the adjusting unit a judgment result that the sound field information changes.

The apparatus for estimating inter-channel delay may be integrated in an encoder, integrated in a multi-user positioning device for communication, or integrated in a multi-sound source position judging device, which is not limited in this embodiment.

The implementation of functions of respective units in the apparatus for estimating inter-channel delay is described in the corresponding implementation in the above method, which is not repeated herein.

To facilitate comprehension of persons skilled in the art, the cross-correlation function is described below with the current frame cross-correlation function and the short-time cross-correlation function as examples, and the cumulative cross-correlation function is described below respectively with the cumulative cross-correlation function previous to the current frame cross-correlation function and the long-time cross-correlation function as examples, but are not limited thereto.

In an embodiment that takes the current frame cross-correlation function as an example:

the extracting unit specifically includes: a current frame extracting unit and a cumulative extracting unit, where the current frame extracting unit is configured to extract sound field information of a current frame cross-correlation function from a cross-correlation function of signals of the left and right sound channels; and the cumulative extracting unit is configured to extract sound field information from a cumulative cross-correlation function previous to the current frame cross-correlation function.

The current frame extracting unit includes: a first calculating unit and a first determining unit. The first calculating unit is configured to calculate a sum of current frame cross-correlation functions of first-part delay time and a sum of current frame cross-correlation functions of second-part delay time, for example, calculate a sum of current frame cross-correlation functions with the delay greater than or equal to 0 and a sum of current frame cross-correlation functions with the delay less than or equal to 0. The first determining unit is configured to operate the sum, which is calculated by the first calculating unit, of the current frame cross-correlation functions of the first-part delay time and the sum, which is calculated by the first calculating unit, of the current frame cross-correlation functions of the second-part delay time, so as to obtain a first sound field information value, for example, configured to determine a ratio of a sum of current frame cross-correlation functions with the delay greater than or equal to 0 and a sum of current frame cross-correlation functions with the delay less than or equal to 0, where the ratio is referred to as a first ratio; or, configured to determine a difference between the sum of current frame cross-correlation functions with the delay greater than or equal to 0 and the sum of current frame cross-correlation functions with the delay less than or equal to 0, where the difference is referred to as a first difference.

The cumulative extracting unit includes: a second calculating unit and a second determining unit. The second calculating unit is configured to calculate a sum of cumulative cross-correlation functions of first-part delay time and a sum of cumulative cross-correlation functions of second-part delay time, for example, calculate a sum of cumulative cross-correlation functions with the delay greater than or equal to 0 and a sum of cumulative cross-correlation functions with the delay less than or equal to 0. The second determining unit is configured to operate the sum, which is calculated by the second calculating unit, of the cumulative cross-correlation functions of the first-part delay time and the sum, which is calculated by the second calculating unit, of cumulative cross-correlation functions of second-part delay time, so as to obtain a second sound field information value, for example, configured to determine a ratio of a sum of cumulative cross-correlation functions with the delay greater than or equal to 0 and a sum of cumulative cross-correlation functions with the delay less than or equal to 0, where the ratio is referred to as a second ratio; or, configured to determine a difference between the sum of cumulative cross-correlation functions with the delay greater than or equal to 0 and the sum of cumulative cross-correlation functions with the delay less than or equal to 0, where the difference is referred to as a second difference.

The adjusting unit includes: a coefficient calculating unit and a first adjusting unit, and/or, a first sound field type determining unit, a first judging unit, a first setting unit, and a second adjusting unit.

The coefficient calculating unit is configured to calculate a weighting coefficient of the cumulative cross-correlation function according to the first sound field information value and the second sound field information value, for example, calculate the weighting coefficient of the cumulative cross-correlation function according to the first ratio determined by the first determining unit and the second ratio determined by the second determining unit.

The first adjusting unit is configured to adjust the cumulative cross-correlation function by using the weighting coefficient calculated by the coefficient calculating unit, so as to obtain the adjusted cumulative cross-correlation function.

The first sound field type determining unit is configured to determine corresponding sound field types according to the first sound field information value determined by the first determining unit and the second sound field information value determined by the second determining unit, for example, configured to determine the corresponding sound field types according to the first ratio determined by the first determining unit and the second ratio determined by the second determining unit.

The first judging unit is configured to judge whether the sound field type corresponding to the first sound field information value and the sound field type corresponding to the second sound field information value are the same, and send a judgment result, for example, configured to judge whether the sound field type corresponding to the first ratio and the sound field type corresponding to the second ratio are the same, and send a judgment result.

The first setting unit is configured to set different weighting coefficients of the cumulative cross-correlation function according to the received judgment result sent by the first judging unit.

The second adjusting unit is configured to adjust the cumulative cross-correlation function by using the different weighting coefficients set by the first setting unit, so as to obtain the adjusted cumulative cross-correlation function.

In the other embodiment that takes the short-time cross-correlation function as an example, the extracting unit specifically includes:

a short-time extracting unit, configured to extract sound field information of a short-time cross-correlation function from a cross-correlation function determined by a determining unit; and a long-time cumulative extracting unit, configured to extract sound field information of a long-time cumulative cross-correlation function previous to the short-time cross-correlation function from a cumulative cross-correlation function determined by the determining unit.

The short-time extracting unit includes: a third calculating unit and a third determining unit. The third calculating unit is configured to calculate a sum of short-time cross-correlation functions of third-part delay time and a sum of short-time cross-correlation functions of fourth-part delay time, for example, configured to calculate a sum of short-time cross-correlation functions with the delay greater than or equal to 0 and a sum of short-time cross-correlation functions with the delay less than or equal to 0. The third determining unit is configured to operate the sum of the short-time cross-correlation functions of the third-part delay time and the sum of the short-time cross-correlation functions of the fourth-part delay time, so as to obtain a third sound field information value, for example, configured to determine a ratio of a sum of short-time cross-correlation functions with the delay greater than or equal to 0 and a sum of short-time cross-correlation functions with the delay less than or equal to 0, where the ratio is referred to as a third ratio; or, configured to determine a difference between the sum of short-time cross-correlation functions with the delay greater than or equal to 0 and the sum of short-time cross-correlation functions with the delay less than or equal to 0, where the difference is referred to as a third difference.

The long-time cumulative extracting unit includes: a fourth calculating unit and a fourth determining unit. The fourth calculating unit is configured to calculate a sum of long-time cumulative cross-correlation functions of third-part delay time and a sum of long-time cumulative cross-correlation functions of fourth-part delay time, for example, configured to calculate a sum of long-time cumulative cross-correlation functions with the delay greater than or equal to 0 and a sum of long-time cumulative cross-correlation functions with the delay less than or equal to 0. The fourth determining unit is configured to operate the sum of the long-time cumulative cross-correlation functions of the third part delay time and the sum of the long-time cumulative cross-correlation functions of the fourth-part delay time, so as to obtain a fourth sound field information value, for example, configured to determine a ratio of a sum of long-time cumulative cross-correlation functions with the delay greater than or equal to 0 and a sum of long-time cumulative cross-correlation functions with the delay less than or equal to 0, where the ratio is referred to as a fourth ratio; or, configured to determine a difference between the sum of long-time cumulative cross-correlation functions with the delay greater than or equal to 0 and the sum of long-time cumulative cross-correlation functions with the delay less than or equal to 0, where the difference is referred to as a fourth difference.

The adjusting unit includes: a second sound field type determining unit, a second judging unit, a second setting unit, and a third adjusting unit, where the second sound field type determining unit is configured to determine corresponding sound field types according to the third sound field information value determined by the third determining unit and the fourth sound field information value determined by the fourth determining unit, for example, configured to determine corresponding sound field types according to the third ratio determined by the third determining unit and the fourth ratio determined by the fourth determining unit; the second judging unit is configured to judge whether the sound field type corresponding to the third sound field information value and the sound field type corresponding to the fourth sound field information value are the same, and send a judgment result, for example, configured to judge whether the sound field type corresponding to the third ratio and the sound field type corresponding to the fourth ratio are the same, and send a judgment result; the second setting unit is configured to set different weighting coefficients of the cumulative cross-correlation function according to the received judgment result sent by the second judging unit; and the third adjusting unit is configured to adjust the cumulative cross-correlation function by using the different weighting coefficients set by the second setting unit, so as to obtain the adjusted cumulative cross-correlation function.

Figure 14:
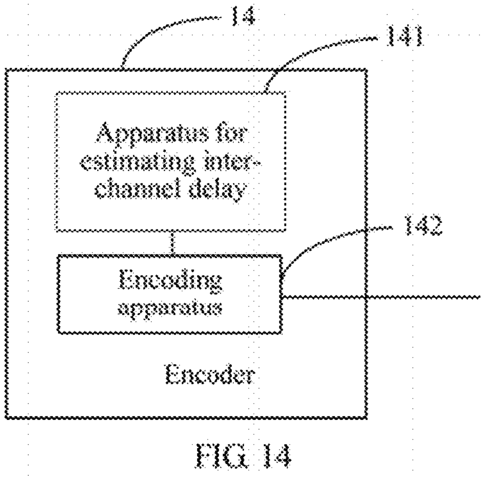
FIG. 14 is a schematic structural view of an encoder according to an embodiment of the present invention.

An embodiment of the present invention further provides an encoder 14, and a schematic structural view of the encoder 14 is shown in FIG. 14 in detail. The encoder 14 includes an apparatus 141 for estimating inter-channel delay and an encoding apparatus 142. The apparatus 141 for estimating inter-channel delay is configured to determine a cross-correlation function and a cumulative cross-correlation function of signals of the left and right sound channels, obtain signal sound field information from the cross-correlation function and the cumulative cross-correlation function respectively, obtain adjustment information of the cumulative cross-correlation function according to the sound field information that is respectively obtained, adjust the cumulative cross-correlation function by using the adjustment information to obtain the adjusted cumulative cross-correlation function, determine a time corresponding to a maximum value in the adjusted cumulative cross-correlation function as an inter-channel delay, and output the inter-channel delay to the encoding apparatus. The encoding apparatus is configured to encode the received inter-channel delay, and send the encoded inter-channel delay.

In the encoder, the implementation of functions of respective units in the apparatus for estimating inter-channel delay is described in the corresponding implementation in the above method, which is not repeated herein.

In view of the above embodiment, when the sound field of the signals of the left and right sound channels changes, the information about the changes of the sound field is extracted from the determined cross-correlation function and cumulative cross-correlation function of the signals of the left and right sound channels, and the delay between the signals of the left and right sound channels can be estimated correctly according to the information about the changes of the sound field, so that the opposite end can synthesize the signals correctly according to the received delay, thereby improving the stability of the synthetic stereo sound field.

Through the above description of the embodiments, it is apparent to those skilled in the art that the embodiments of the present invention may be accomplished by software on a necessary universal hardware platform, and definitely may also be accomplished by hardware. In most cases, the former accomplishing manner is preferred. Therefore, the above technical solutions or the part that makes contributions to the prior art can be substantially embodied in the form of a software product. The computer software product may be stored in a computer readable storage medium such as a ROM/RAM, a magnetic disk, or an optical disk, and contain several instructions to instruct a computer equipment (for example, a personal computer, a server, or a network equipment) to perform the method as described in the embodiments of the present invention or in some parts of the embodiments.

The above descriptions are merely exemplary embodiments of the present invention. It should be noted by persons of ordinary skill in the art that modifications and improvements may be made without departing from the principle of the present invention, which should be construed as falling within the scope of the present invention.

The invention claimed is:

1. A method for estimating inter-channel delay, comprising;

obtaining signal sound field information from a cross-correlation function and a cumulative cross-correlation function of signals of left and right sound channels respectively;

obtaining adjustment information of the cumulative cross-correlation function according to the sound field information that is respectively obtained;

using a processor and the adjustment information to adjust the cumulative cross-correlation function to obtain an adjusted cumulative cross-correlation function; and determining a time corresponding to a maximum value in the adjusted cumulative cross-correlation function as an inter-channel delay.

2. The method according to claim 1, wherein the obtaining signal sound field information from the cross-correlation function and the cumulative cross-correlation function of the signals of the left and right sound channels respectively comprises:

extracting sound field information from the cross-correlation function of the signals of the left and right sound channels, and extracting sound field information of the cumulative cross-correlation function previous to the cross-correlation function.

3. The method according to claim 2, wherein the extracting the sound field information from the cross-correlation function of the signals of the left and right sound channels, and extracting the sound field information of the cumulative cross-correlation function previous to the cross-correlation function specifically comprises:

operating a sum of cross-correlation functions of first part delay time and a sum of cross-correlation functions of second part delay time, so as to obtain a first sound field information value; and operating a sum of cumulative cross-correlation functions of first-part delay time and a sum of cumulative cross-correlation functions of second-part delay time, so as to obtain a second sound field information value.

4. The method according to claim 3, wherein the obtaining adjustment information of the cumulative cross-correlation function according to the sound field information that is respectively obtained comprises:

calculating a weighting coefficient of the cumulative cross-correlation function according to the first sound field information value and the second sound field information value; and the adjusting the cumulative cross-correlation function by using the adjustment information, so as to obtain the adjusted cumulative cross-correlation function comprises:

adjusting the cumulative cross-correlation function by using the weighting coefficient, so as to obtain the adjusted cumulative cross-correlation function.

5. The method according to claim 3, wherein the obtaining adjustment information of the cumulative cross-correlation function according to the sound field information that is respectively obtained comprises:

determining a sound field type corresponding to the first sound field information value and a sound field type corresponding to the second sound field information value; and judging whether the sound field type corresponding to the first sound field information value and the sound field type corresponding to the second sound field information value are the same, and setting a weighting coefficient of the cumulative cross-correlation function according to a judgment result; and the adjusting the cumulative cross-correlation function by using the adjustment information, so as to obtain the adjusted cumulative cross-correlation function comprises:

adjusting the cumulative cross-correlation function by using the set weighting coefficient, so as to obtain the adjusted cumulative cross-correlation function.

6. The method according to claim 5, wherein the determining the sound field type corresponding to the first sound field information value comprises: judging whether the first sound field information value is greater than a preset first threshold; if the first sound field information value is greater than the preset first threshold, setting a flag of the sound field type corresponding to the first sound field information value as 1; otherwise, continuing to judge whether the first sound field information value is greater than or equal to a second threshold, and if the first sound field information value is greater than or equal to the second threshold, setting the flag of the sound field type corresponding to the first sound field information value as 0; otherwise, setting the flag of the sound field type corresponding to the first sound field information value as −1, wherein the second threshold is less than the first threshold; and the determining the sound field type corresponding to the second sound field information value comprises: judging whether the second sound field information value is greater than the preset first threshold; if the second sound field information value is greater than the preset first threshold, setting a flag of the sound field type corresponding to the second sound field information value as 1; otherwise, continuing to judge wether the second sound field information value is greater than or equal to the second threshold, and if the second sound field information value is greater than or equal to the second threshold, setting the flag of the sound field type corresponding to the second sound field information value as 0; otherwise, setting the flag of the sound field type corresponding to the second sound field information value as −1, wherein the second threshold is less than the first threshold.

7. The method according to claim 3, wherein when the cross-correlation function is a current frame cross-correlation function, the cumulative cross-correlation function previous to the cross-correlation function is a cumulative cross-correlation function previous to the current frame cross-correlation function; and when the cross-correlation function is a short-time cross-correlation function, the cumulative cross-correlation function previous to the cross-correlation function is a long-time cross-correlation function.

8. The method according to claim 7, wherein when the cross-correlation function is a short-time cross-correlation function, the method further comprises:

extracting a signal type from the cross-correlation function of the signals of the left and right sound channels; and obtaining adjustment information of the cumulative cross-correlation function according to the sound field information that is respectively obtained and the signal type.

9. The method according to claim 8, wherein the obtaining adjustment information of the cumulative cross-correlation function according to the sound field information that is respectively obtained and the signal type comprises:

calculating a weighting coefficient of the cumulative cross-correlation function according to the first sound field information value and second sound field information value and a value corresponding to the signal type; and the adjusting the cumulative cross-correlation function by using the adjustment information, so as to obtain the adjusted cumulative cross-correlation function comprises:

adjusting cumulative cross-correlation function by using the weighting coefficient, so as to obtain the adjusted cumulative cross-correlation function.

10. The method according to claim 1, further comprising:

judging whether the sound field information changes, and if the sound field information changes, performing the step of adjusting the cumulative cross-correlation function according to the sound field information.

11. An apparatus for estimating inter-channel delay, comprising:

an extracting unit, configured to obtain signal sound field information from a cross-correlation function and a cumulative cross-correlation function of signals of left and right sound channels respectively;

an adjusting unit, configured to obtain adjustment information of the cumulative cross-correlation function according to the sound field information that is respectively obtained by the extracting unit, and adjust the cumulative cross-correlation function by using the adjustment information, so as to obtain the adjusted cumulative cross-correlation function; and a delay estimating unit, configured to determine a time corresponding to a maximum value in the cumulative cross-correlation function adjusted by the adjusting unit as the inter-channel delay.

12. The apparatus according to claim 11, wherein the extracting unit specifically comprises:

a first extracting unit, configured to extract sound field information from the cross-correlation function of the signals of the left and right sound channels; and a second extracting unit, configured to extract sound field information from the cumulative cross-correlation function previous to the cross-correlation function extracted by the first extracting unit.

13. The apparatus according to claim 12, wherein the first extracting unit comprises:

a first calculating unit, configured to calculate a sum of cross-correlation function of first-part delay time and a sum of cross-correlation functions of second-part delay time; and a first determining unit, configured to operate the sum, which is calculated by the first calculating unit, of the cross-correlation functions of the first-part delay time and the sum, which is calculated by the first calculating unit, of the cross-correlation functions of second-part delay time, so as to obtain a first sound field information value; and the second extracting unit comprises:

a second calculating unit, configured to calculate a sum of cumulative cross-correlation functions of first-part delay time and a sum of cumulative cross-correlation functions of second-part delay time; and a second determining unit, configured to operate the sum, which is calculated by the second calculating unit, of the cumulative cross-correlation functions of the first-part delay time and the sum, which is calculated by the second calculating unit, of the cumulative cross-correlation functions of the second-part delay time, so as to obtain a second sound field information value.

14. The apparatus according to claim 13, wherein the adjusting unit comprises: a first coefficient calculating unit and a first adjusting unit, and wherein the first coefficient calculating unit is configured to calculate a weighting coefficient of the cumulative cross-correlation function according to the first sound field information value and the second sound field information value; and the first adjusting unit is configured to adjust the cumulative cross-correlation function by using the weighting coefficient calculated by the first coefficient calculating unit, so as to obtain the adjusted cumulative cross-correlation function.

15. The apparatus according to claim 13, wherein the adjusting unit comprises: a first sound field type determining unit, a first judging unit, a first setting unit, and a second adjusting unit, and wherein the first sound field type determining unit is configured to determine corresponding sound field types according to the first sound field information value determined by the first determining unit and the second sound field information value determined by the second determining unit;

the first judging unit is configured to judge whether the sound field type corresponding to the first sound field information value and the sound field type corresponding to the second sound field information value are the same, and send a judgment result;

the first setting unit is configured to set different weighting coefficients of the cumulative cross-correlation function according to the received judgment result sent by the first judging unit; and the second adjusting unit is configured to adjust the cumulative cross-correlation function by using the different weighting coefficients set by the first setting unit, so as to obtain the adjusted cumulative cross-correlation function.

16. The apparatus according to claim 12, wherein the cross-correlation function of the signals of the left and right sound channels by the first extracting unit comprises: a current frame cross-correlation function and a short-time cross-correlation function; and the cumulative cross-correlation function previous to the cross-correlation function from the first extracting unit by the second extracting unit comprises: a cumulative cross-correlation function previous to the current frame cross-correlation function and a long-time cross-correlation function.

17. The apparatus according to claim 16, wherein, when the cross-correlation function is the short-time cross-correlation function, the first extracting unit further comprises: a third extracting unit, configured to extract a signal type from the cross-correlation function of the signals of the left and right sound channels; and the adjusting unit further comprises:

a second coefficient calculating unit, configured to perform another weighting calculation on the cumulative cross-correlation function's weighting coefficient calculated by the first coefficient calculating unit according to a value corresponding to the signal type, so as to obtain a calculated weighting coefficient of the cumulative cross-correlation function; and a third adjusting unit, configured to adjust the cumulative cross-correlation function by using the calculated weighting coefficient calculated by the second coefficient calculating unit, so as to obtain the adjusted cumulative cross-correlation function.

18. The apparatus according to claim 11, further comprising:

a judging unit, configured to judge whether the sound field information changes, and send to the adjusting unit a judgment result that the sound field information changes.

19. The apparatus according to claim 11, wherein the apparatus for estimating inter-channel delay is integrated in an encoder, or integrated in a multi-user positioning device for communication, or integrated in a multi-sound source position judging device.

20. An encoder, comprising: an apparatus for estimating inter-channel delay and an encoding apparatus, wherein the apparatus for estimating inter-channel delay comprises:

an extracting unit, configured to obtain signal sound field information from a cross-correlation function and a cumulative cross-correlation function of signals of left and right sound channels respectively;

adjusting unit, configured to obtain adjustment information of the cumulative cross-correlation function according to the sound field information that is respectively obtained by the extracting unit, and adjust the cumulative cross-correlation function by using the adjustment information, so as to obtain the adjusted cumulative cross-correlation function; and a delay estimating unit, configured to determine a time corresponding to a maximum value in the cumulative cross-correlation function adjusted by the adjusting unit as the inter-channel delay; and the encoding apparatus is configured to encode the received inter-channel delay, and send the encoded inter-channel delay.

* * * * *

UNITED STATES PATENT AND TRADEMARK OFFICE

CERTIFICATE OF CORRECTION

PATENT NO. : 8,417,473 B2
APPLICATION NO. : 13/245303
DATED : April 9, 2013
INVENTOR(S) : Wenhai Wu et al.

It is certified that error appears in the above-identified patent and that said Letters Patent is hereby corrected as shown below:

In the Claims:

Column 24 Line 61 - Claim 6 should read as follows:

6. The method according to claim 5 , wherein the determining sound field type corresponding to the first sound field information value comprises: judging whether the first sound field information value is greater than a preset first threshold; if the first sound field information value is greater than the preset first threshold, setting a flag of the sound field type corresponding to the first sound field information value as 1; otherwise, continuing to judge whether the first sound field information value is greater than or equal to a second threshold, and if the first sound field information value is greater than or equal to the second threshold, setting the flag of the sound field type corresponding to the first sound field information value as 0; otherwise, setting the flag of the sound field type corresponding to the first sound field information value as -1, wherein the second threshold is less than the first threshold; and
the determining sound field type corresponding to the second sound field information value comprises; judging whether the second sound field information value is greater than the preset first threshold; if the second sound field information value is greater than the preset first threshold, setting a flag of the sound field type corresponding to the second sound field information value as 1; otherwise, continuing to judge whether the second sound field information value is greater than or equal to the second threshold, and if the second sound field information value is greater than or equal to the second threshold, setting the flag of the sound field type corresponding to the second sound field information value as 0; otherwise, setting the flag of the sound field type corresponding to the second sound field information value as -1, wherein the second threshold is less than the first threshold.

Column 26 Line 26 - Claim 13 should read as follows:

13. The apparatus according to claim 12, wherein the first extracting unit comprises:
a first calculating unit, configured to calculate a sum of cross-correlation functions of first-part delay time and a sum of cross-correlation functions of second-part delay time; and
a first determining unit, configured to operate the sum, which is calculated by the first calculating unit, of the cross-correlation functions of the first-part delay time and the sum, which is calculated by the first calculating unit, of the cross-correlation functions of the second-part delay time, so as to obtain a first sound field information value; and
the second extracting unit comprises:
a second calculating unit, configured to calculate a sum of cumulative cross-correlation functions of first-part delay time and a sum of cumulative cross-correlation functions of second-part delay time; and
a second determining unit, configured to operate the sum, which is calculated by the second calculating unit, of the cumlative cross-correlation functions of the first-part delay time and the sum, which is calculated by the second calculating unit, of the cumulative cross-correlation functions of the second-part delay time, so as to obtain a second sound field information value.

Signed and Sealed this
Ninth Day of July, 2013

Teresa Stanek Rea
*Acting Director of the United States Patent and Trademark Office*

Column 28 Line 20 - Claim 20 should read as follows:

20. An encoder, comprising: an apparatus for estimating inter-channel delay and an encoding apparatus, wherein the apparatus for estimating inter-channel delay comprises:

an extracting unit, configured to obtain signal sound field information from a cross-correlation function and a cumulative cross-correlation function of signals of left and right sound channels respectively;

an adjusting unit, configured to obtain adjustment information of the cumulative cross-correlation function according to the sound field information that is respectively obtained by the extracting unit, and adjust the cumulative cross-correlation function by using the adjustment information, so as to obtain the adjusted cumulative cross-correlation function; and a delay estimating unit, configured to determine a time corresponding to a maximum value in the cumulative cross-correlation function adjusted by the adjusting unit as the inter-channel delay; and the encoding apparatus is configured to encode the received inter-channel delay, and send the encoded inter-channel delay.